United States Patent
Usami et al.

(10) Patent No.: US 10,969,696 B2
(45) Date of Patent: Apr. 6, 2021

(54) IMAGE EXPOSURE DEVICE

(71) Applicant: FUJIFILM Corporation, Tokyo (JP)

(72) Inventors: Yoshihisa Usami, Kanagawa (JP);
Shinichiro Sonoda, Kanagawa (JP);
Hirotoshi Yoshizawa, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/807,364

(22) Filed: Mar. 3, 2020

(65) Prior Publication Data
US 2020/0201188 A1    Jun. 25, 2020

Related U.S. Application Data

(63) Continuation of application No. PCT/JP2018/034418, filed on Sep. 18, 2018.

(30) Foreign Application Priority Data

Sep. 22, 2017  (JP) .............................. JP2017-182925

(51) Int. Cl.
*G03F 7/20*    (2006.01)

(52) U.S. Cl.
CPC ........ *G03F 7/70391* (2013.01); *G03F 7/7035* (2013.01)

(58) Field of Classification Search
CPC .......................... G03F 7/7035; G03F 7/70391
See application file for complete search history.

(56) References Cited

U.S. PATENT DOCUMENTS 5,900,637 A * 5/1999 Smith ................ G03F 7/70291
250/492.22
9,126,396 B2    9/2015 Degani et al.
(Continued)

FOREIGN PATENT DOCUMENTS

CN    1602451 A    3/2005
CN    101477311 A    7/2009
(Continued)

OTHER PUBLICATIONS

International Search Report issued in PCT/JP2018/034418; dated Nov. 27, 2018.
(Continued)

*Primary Examiner* — Steven Whitesell Gordon
(74) *Attorney, Agent, or Firm* — Studebaker & Brackett PC

(57) ABSTRACT

Provided is an image exposure device capable of recording a favorable image and capable of decreasing the size of the device.
An image exposure device (10) includes an image display device (12) having pixels (13), a photosensitive recording medium support portion (21) that supports a photosensitive recording medium (14) for recording an image of the image display device (12) in a state in which an exposure surface (14A) of the photosensitive recording medium (14) faces the image display device (12), and a transmitted light control portion (16) that is provided between the image display device (12) and the photosensitive recording medium support portion (21) and is formed by laminating three or more layers of transmission members (100) that have a plurality of openings (102) formed therein and transmit only light incident on the openings (102).

12 Claims, 21 Drawing Sheets

(56) References Cited

U.S. PATENT DOCUMENTS

| | | | |
|---|---|---|---|
| 10,739,681 B2* | 8/2020 | Usami | G03F 7/2008 |
| 2002/0196516 A1* | 12/2002 | Hira | H04N 5/66 |
| | | | 359/237 |
| 2003/0122091 A1* | 7/2003 | Almogy | B82Y 10/00 |
| | | | 250/492.24 |
| 2003/0128399 A1* | 7/2003 | Chino | B41J 2/445 |
| | | | 358/296 |
| 2004/0012851 A1 | 1/2004 | Sato et al. | |
| 2004/0057120 A1* | 3/2004 | Olszak | G02B 3/0062 |
| | | | 359/619 |
| 2004/0124372 A1* | 7/2004 | Gil | G03F 7/70275 |
| | | | 250/492.2 |
| 2007/0134831 A1* | 6/2007 | Jung | G03F 7/70275 |
| | | | 438/30 |
| 2009/0168035 A1* | 7/2009 | Kim | G03F 7/70391 |
| | | | 355/53 |
| 2012/0140194 A1* | 6/2012 | Bae | G03F 7/70391 |
| | | | 355/55 |
| 2020/0012158 A1* | 1/2020 | Arai | G03F 7/70075 |

FOREIGN PATENT DOCUMENTS

| | | |
|---|---|---|
| JP | H11252491 A | 9/1999 |
| JP | 2000075243 A | 3/2000 |
| JP | 2002341459 A | 11/2002 |
| JP | 2003075773 A | 3/2003 |

OTHER PUBLICATIONS

International Preliminary Report on Patentability and Written Opinion issued in PCT/JP2018/034418; dated Mar. 24, 2020.

An Office Action mailed by the State Intellectual Property Office of the People's Republic of China dated Sep. 22, 2020, which corresponds to Chinese Patent Application No. 201880061338.4 and is related to U.S. Appl. No. 16/807,364 with English language translation.

An Office Action; "Notice of Reasons for Refusal," mailed by the Japanese Patent Office dated Feb. 12, 2021, which corresponds to Japanese Patent Application No. 2019-543633 and is related to U.S. Appl. No. 16/807,364; with English language translation.

* cited by examiner

| THIRD LAYER \ SECOND LAYER | 3000 | 3020 | 3040 | 3060 | 3080 | 3100 | 3120 | 3140 | 3160 | 3180 | 3200 | 3220 |
|---|---|---|---|---|---|---|---|---|---|---|---|---|
| 3000 | 22 | 19 | 10 | 7 | 5 | 4 | 4 | 6 | 8 | 7 | 5 | 6 |
| 3050 | 8 | 8 | 8 | 7 | 5 | 4 | 4 | 3 | 3 | 3 | 2 | 2 |
| 3100 | 4 | 4 | 4 | 4 | 4 | 4 | 4 | 3 | 3 | 3 | 2 | 2 |
| 3150 | 7 | 3 | 3 | 3 | 3 | 3 | 3 | 6 | 7 | 3 | 2 | 2 |
| 3200 | 5 | 4 | 2 | 2 | 2 | 2 | 2 | 2 | 2 | 4 | 5 | 4 |
| 3250 | 5 | 4 | 2 | 2 | 2 | 2 | 2 | 2 | 2 | 2 | 2 | 3 |
| 3300 | 8 | 4 | 2 | 2 | 2 | 2 | 2 | 4 | 5 | 2 | 2 | 2 |
| 3350 | 6 | 5 | 3 | 2 | 2 | 2 | 2 | 2 | 3 | 4 | 2 | 2 |
| 3400 | 4 | 4 | 2 | 1 | 1 | 1 | 1 | 1 | 1 | 2 | 2 | 2 |
| 3450 | 6 | 3 | 2 | 1 | 1 | 1 | 1 | 2 | 2 | 1 | 1 | 3 |
| 3500 | 4 | 3 | 2 | 1 | 1 | 1 | 1 | 1 | 2 | 2 | 1 | 1 |
| 3550 | 6 | 5 | 2 | 2 | 1 | 1 | 1 | 1 | 1 | 3 | 1 | 1 |
| 3600 | 5 | 4 | 2 | 2 | 1 | 1 | 1 | 2 | 2 | 2 | 2 | 2 |
| 3650 | 7 | 4 | 2 | 2 | 1 | 1 | 1 | 1 | 3 | 1 | 2 | 2 |
| 3700 | 7 | 4 | 3 | 1 | 1 | 1 | 1 | 2 | 2 | 2 | 1 | 2 |
| 3750 | 6 | 4 | 3 | 2 | 2 | 1 | 1 | 2 | 2 | 2 | 2 | 1 |
| 3800 | 7 | 4 | 3 | 2 | 2 | 1 | 1 | 1 | 2 | 2 | 2 | 2 |
| 3850 | 7 | 5 | 2 | 2 | 2 | 1 | 1 | 2 | 1 | 2 | 2 | 2 |
| 3900 | 7 | 5 | 2 | 1 | 1 | 1 | 1 | 2 | 2 | 2 | 1 | 2 |
| 3950 | 6 | 4 | 2 | 2 | 1 | 1 | 1 | 1 | 2 | 2 | 2 | 1 |
| 4000 | 8 | 6 | 3 | 2 | 2 | 2 | 1 | 2 | 2 | 3 | 2 | 2 |
| 4050 | 6 | 3 | 3 | 3 | 2 | 2 | 2 | 2 | 3 | 2 | 2 | 2 |
| 4100 | 7 | 5 | 2 | 2 | 2 | 2 | 2 | 2 | 2 | 2 | 1 | 2 |
| 4150 | 7 | 5 | 2 | 1 | 1 | 1 | 1 | 2 | 3 | 1 | 2 | 2 |
| 4200 | 5 | 4 | 2 | 2 | 1 | 1 | 1 | 2 | 2 | 2 | 2 | 2 |
| 4250 | 6 | 4 | 2 | 2 | 1 | 1 | 1 | 2 | 2 | 2 | 1 | 1 |
| 4300 | 7 | 3 | 2 | 1 | 1 | 1 | 1 | 2 | 2 | 2 | 1 | 2 |
| 4350 | 6 | 4 | 3 | 1 | 1 | 1 | 1 | 2 | 2 | 2 | 1 | 1 |
| 4400 | 8 | 5 | 2 | 2 | 2 | 1 | 1 | 2 | 2 | 3 | 2 | 3 |
| 4450 | 6 | 3 | 3 | 2 | 2 | 2 | 1 | 1 | 2 | 1 | 1 | 1 |
| 4500 | 11 | 8 | 4 | 3 | 2 | 2 | 2 | 3 | 3 | 3 | 3 | 2 |
| 4550 | 6 | 5 | 5 | 4 | 3 | 2 | 2 | 3 | 2 | 2 | 1 | 1 |
| 4600 | 8 | 5 | 3 | 3 | 3 | 2 | 2 | 2 | 3 | 4 | 2 | 3 |

FIG. 18

| THIRD LAYER | SECOND LAYER 1000 | 1020 | 1040 | 1060 | 1080 | 1100 | 1120 | 1140 | 1160 | 1180 | 1200 | 1220 |
|---|---|---|---|---|---|---|---|---|---|---|---|---|
| 1000 | 8 | 7 | 4 | 3 | 2 | 2 | 2 | 2 | 3 | 3 | 2 | 3 |
| 1050 | 3 | 3 | 3 | 3 | 2 | 2 | 2 | 1 | 1 | 1 | 1 | 1 |
| 1100 | 2 | 2 | 2 | 2 | 2 | 2 | 2 | 1 | 1 | 1 | 1 | 1 |
| 1150 | 3 | 1 | 1 | 1 | 1 | 1 | 1 | 2 | 3 | 1 | 1 | 1 |
| 1200 | 2 | 2 | 1 | 1 | 1 | 1 | 1 | 1 | 1 | 2 | 2 | 2 |
| 1250 | 2 | 2 | 1 | 1 | 1 | 1 | 1 | 1 | 1 | 1 | 1 | 2 |
| 1300 | 3 | 1 | 1 | 1 | 1 | 1 | 1 | 2 | 2 | 1 | 1 | 1 |
| 1350 | 3 | 3 | 2 | 1 | 1 | 1 | 1 | 1 | 1 | 2 | 1 | 1 |
| 1400 | 2 | 2 | 1 | 1 | 1 | 1 | 1 | 1 | 1 | 2 | 2 | 2 |
| 1450 | 2 | 1 | 1 | 1 | 1 | 1 | 1 | 1 | 1 | 1 | 1 | 1 |
| 1500 | 4 | 3 | 2 | 1 | 1 | 1 | 1 | 1 | 2 | 2 | 1 | 1 |
| 1550 | 3 | 2 | 2 | 2 | 1 | 1 | 1 | 2 | 1 | 1 | 1 | 1 |
| 1600 | 2 | 2 | 1 | 1 | 1 | 1 | 1 | 1 | 1 | 2 | 2 | 2 |
| 1650 | 3 | 2 | 1 | 1 | 1 | 1 | 1 | 1 | 2 | 1 | 1 | 1 |
| 1700 | 3 | 2 | 2 | 1 | 1 | 1 | 1 | 2 | 1 | 1 | 1 | 1 |
| 1750 | 2 | 2 | 1 | 1 | 1 | 1 | 1 | 1 | 1 | 1 | 1 | 1 |
| 1800 | 2 | 1 | 1 | 1 | 1 | 1 | 1 | 1 | 1 | 2 | 2 | 2 |
| 1850 | 4 | 2 | 1 | 1 | 1 | 1 | 1 | 2 | 1 | 2 | 1 | 1 |
| 1900 | 2 | 2 | 2 | 1 | 1 | 1 | 1 | 1 | 1 | 1 | 1 | 1 |
| 1950 | 4 | 3 | 2 | 2 | 1 | 1 | 1 | 1 | 1 | 1 | 1 | 1 |
| 2000 | 8 | 5 | 3 | 2 | 2 | 1 | 1 | 2 | 2 | 2 | 2 | 1 |
| 2050 | 4 | 4 | 4 | 3 | 2 | 2 | 2 | 1 | 1 | 1 | 1 | 1 |
| 2100 | 2 | 2 | 2 | 2 | 2 | 2 | 2 | 1 | 1 | 1 | 1 | 1 |
| 2150 | 4 | 2 | 2 | 2 | 2 | 2 | 2 | 2 | 3 | 1 | 1 | 1 |
| 2200 | 2 | 1 | 1 | 1 | 1 | 1 | 1 | 1 | 1 | 1 | 2 | 1 |
| 2250 | 2 | 2 | 1 | 1 | 1 | 1 | 1 | 1 | 1 | 1 | 1 | 1 |
| 2300 | 5 | 2 | 1 | 1 | 1 | 1 | 1 | 2 | 3 | 1 | 1 | 1 |
| 2350 | 3 | 3 | 1 | 1 | 1 | 1 | 1 | 1 | 2 | 2 | 1 | 1 |
| 2400 | 5 | 2 | 2 | 1 | 1 | 1 | 1 | 2 | 1 | 1 | 2 | 1 |
| 2450 | 4 | 2 | 1 | 1 | 1 | 1 | 1 | 2 | 2 | 1 | 1 | 2 |
| 2500 | 4 | 3 | 2 | 1 | 1 | 1 | 1 | 1 | 2 | 2 | 1 | 1 |
| 2550 | 4 | 3 | 2 | 2 | 1 | 1 | 1 | 2 | 1 | 1 | 1 | 1 |
| 2600 | 5 | 2 | 2 | 2 | 1 | 1 | 1 | 1 | 2 | 1 | 2 | 1 |

FIG. 19

| THIRD LAYER | SECOND LAYER 5000 | 5020 | 5040 | 5060 | 5080 | 5100 | 5120 | 5140 | 5160 | 5180 | 5200 | 5220 |
|---|---|---|---|---|---|---|---|---|---|---|---|---|
| 5000 | 37 | 30 | 15 | 10 | 8 | 7 | 6 | 10 | 11 | 11 | 10 | 8 |
| 5050 | 12 | 12 | 12 | 10 | 8 | 7 | 6 | 5 | 4 | 4 | 3 | 3 |
| 5100 | 7 | 7 | 7 | 7 | 7 | 7 | 6 | 5 | 4 | 4 | 3 | 3 |
| 5150 | 12 | 5 | 5 | 5 | 5 | 5 | 5 | 10 | 9 | 4 | 3 | 3 |
| 5200 | 10 | 7 | 3 | 3 | 3 | 3 | 3 | 3 | 3 | 7 | 10 | 7 |
| 5250 | 8 | 6 | 3 | 3 | 3 | 3 | 3 | 3 | 3 | 3 | 3 | 3 |
| 5300 | 11 | 6 | 3 | 3 | 3 | 3 | 3 | 7 | 6 | 3 | 3 | 3 |
| 5350 | 10 | 6 | 2 | 2 | 2 | 2 | 2 | 2 | 4 | 6 | 2 | 2 |
| 5400 | 9 | 6 | 3 | 2 | 2 | 2 | 2 | 2 | 2 | 3 | 5 | 3 |
| 5450 | 10 | 6 | 4 | 2 | 2 | 2 | 2 | 4 | 4 | 2 | 3 | 5 |
| 5500 | 11 | 6 | 4 | 2 | 2 | 2 | 2 | 2 | 5 | 4 | 2 | 2 |
| 5550 | 10 | 7 | 4 | 2 | 2 | 2 | 2 | 3 | 2 | 4 | 4 | 2 |
| 5600 | 11 | 7 | 4 | 3 | 2 | 2 | 2 | 3 | 4 | 3 | 5 | 3 |
| 5650 | 10 | 8 | 3 | 3 | 2 | 2 | 2 | 2 | 4 | 3 | 3 | 4 |
| 5700 | 11 | 7 | 3 | 3 | 1 | 1 | 1 | 3 | 2 | 3 | 1 | 3 |
| 5750 | 10 | 6 | 3 | 2 | 2 | 1 | 1 | 2 | 3 | 3 | 2 | 1 |
| 5800 | 10 | 6 | 4 | 3 | 2 | 1 | 1 | 1 | 3 | 2 | 2 | 2 |
| 5850 | 11 | 5 | 3 | 2 | 2 | 2 | 1 | 3 | 2 | 3 | 3 | 3 |
| 5900 | 10 | 6 | 3 | 2 | 2 | 2 | 1 | 2 | 2 | 2 | 3 | 2 |
| 5950 | 10 | 6 | 3 | 2 | 1 | 1 | 1 | 1 | 3 | 2 | 3 | 2 |
| 6000 | 8 | 6 | 3 | 2 | 2 | 2 | 1 | 2 | 2 | 3 | 2 | 2 |
| 6050 | 10 | 7 | 3 | 2 | 2 | 2 | 2 | 2 | 2 | 3 | 2 | 2 |
| 6100 | 10 | 5 | 4 | 2 | 2 | 2 | 2 | 2 | 2 | 2 | 1 | 2 |
| 6150 | 10 | 5 | 3 | 2 | 1 | 1 | 1 | 2 | 2 | 3 | 2 | 2 |
| 6200 | 10 | 7 | 3 | 2 | 2 | 1 | 1 | 2 | 2 | 3 | 2 | 2 |
| 6250 | 10 | 7 | 4 | 3 | 2 | 2 | 2 | 2 | 3 | 2 | 2 | 2 |
| 6300 | 10 | 5 | 4 | 3 | 2 | 2 | 2 | 3 | 2 | 3 | 3 | 2 |
| 6350 | 10 | 6 | 2 | 2 | 2 | 2 | 2 | 3 | 1 | 3 | 3 | 2 |
| 6400 | 11 | 7 | 4 | 2 | 2 | 2 | 2 | 4 | 2 | 2 | 2 | 3 |
| 6450 | 11 | 5 | 3 | 2 | 2 | 1 | 1 | 2 | 2 | 2 | 3 | 2 |
| 6500 | 11 | 7 | 4 | 2 | 2 | 1 | 1 | 2 | 2 | 3 | 3 | 2 |
| 6550 | 11 | 7 | 4 | 2 | 2 | 1 | 1 | 2 | 3 | 2 | 2 | 2 |
| 6600 | 11 | 7 | 2 | 2 | 2 | 2 | 1 | 2 | 3 | 2 | 2 | 3 |

FIG. 20

| THIRD LAYER | SECOND LAYER 7000 | 7020 | 7040 | 7060 | 7080 | 7100 | 7120 | 7140 | 7160 | 7180 | 7200 | 7220 |
|---|---|---|---|---|---|---|---|---|---|---|---|---|
| 7000 | 51 | 40 | 22 | 13 | 11 | 9 | 7 | 12 | 17 | 15 | 14 | 12 |
| 7050 | 16 | 16 | 16 | 13 | 11 | 9 | 7 | 6 | 6 | 5 | 5 | 4 |
| 7100 | 9 | 9 | 9 | 9 | 9 | 9 | 7 | 6 | 6 | 5 | 5 | 4 |
| 7150 | 15 | 6 | 6 | 6 | 6 | 6 | 6 | 12 | 14 | 5 | 5 | 4 |
| 7200 | 14 | 9 | 5 | 5 | 5 | 5 | 5 | 5 | 5 | 11 | 14 | 9 |
| 7250 | 11 | 9 | 4 | 4 | 4 | 4 | 4 | 4 | 4 | 4 | 4 | 5 |
| 7300 | 13 | 6 | 3 | 3 | 3 | 3 | 3 | 8 | 8 | 3 | 3 | 3 |
| 7350 | 13 | 8 | 5 | 3 | 3 | 3 | 3 | 3 | 6 | 8 | 3 | 3 |
| 7400 | 11 | 9 | 5 | 3 | 3 | 3 | 3 | 3 | 3 | 5 | 7 | 4 |
| 7450 | 14 | 8 | 4 | 2 | 2 | 2 | 2 | 5 | 5 | 2 | 3 | 6 |
| 7500 | 11 | 8 | 4 | 2 | 2 | 2 | 2 | 2 | 5 | 4 | 2 | 2 |
| 7550 | 12 | 8 | 4 | 2 | 2 | 2 | 2 | 3 | 2 | 5 | 4 | 2 |
| 7600 | 14 | 9 | 4 | 3 | 2 | 2 | 2 | 4 | 5 | 4 | 5 | 3 |
| 7650 | 13 | 8 | 4 | 4 | 2 | 2 | 2 | 2 | 5 | 2 | 4 | 5 |
| 7700 | 16 | 8 | 6 | 4 | 2 | 2 | 2 | 4 | 4 | 5 | 2 | 4 |
| 7750 | 13 | 8 | 5 | 4 | 3 | 2 | 2 | 4 | 3 | 4 | 4 | 2 |
| 7800 | 13 | 10 | 4 | 3 | 3 | 2 | 2 | 2 | 4 | 4 | 5 | 3 |
| 7850 | 15 | 10 | 5 | 4 | 3 | 2 | 2 | 4 | 3 | 4 | 4 | 4 |
| 7900 | 13 | 10 | 3 | 2 | 2 | 2 | 1 | 3 | 2 | 3 | 3 | 3 |
| 7950 | 13 | 8 | 4 | 3 | 2 | 2 | 1 | 1 | 3 | 3 | 2 | 2 |
| 8000 | 8 | 6 | 3 | 2 | 2 | 2 | 1 | 2 | 2 | 3 | 2 | 2 |
| 8050 | 13 | 8 | 3 | 2 | 2 | 2 | 1 | 2 | 3 | 2 | 2 | 3 |
| 8100 | 13 | 8 | 4 | 3 | 2 | 2 | 1 | 1 | 3 | 3 | 3 | 2 |
| 8150 | 13 | 7 | 3 | 2 | 2 | 2 | 1 | 2 | 4 | 3 | 3 | 3 |
| 8200 | 13 | 7 | 4 | 3 | 2 | 2 | 2 | 2 | 3 | 3 | 2 | 3 |
| 8250 | 13 | 8 | 4 | 2 | 2 | 2 | 2 | 2 | 3 | 2 | 3 | 2 |
| 8300 | 14 | 8 | 4 | 4 | 2 | 2 | 2 | 3 | 3 | 2 | 3 | 3 |
| 8350 | 14 | 9 | 5 | 3 | 2 | 2 | 1 | 2 | 3 | 3 | 3 | 2 |
| 8400 | 11 | 8 | 4 | 3 | 2 | 2 | 2 | 4 | 3 | 3 | 2 | 3 |
| 8450 | 13 | 8 | 4 | 3 | 3 | 2 | 2 | 3 | 4 | 2 | 3 | 3 |
| 8500 | 11 | 7 | 4 | 2 | 2 | 2 | 2 | 2 | 4 | 3 | 1 | 2 |
| 8550 | 15 | 9 | 4 | 3 | 2 | 2 | 2 | 4 | 3 | 3 | 2 | 2 |
| 8600 | 13 | 8 | 5 | 3 | 2 | 1 | 1 | 2 | 3 | 3 | 2 | 3 |

FIG. 21

| THIRD LAYER | SECOND LAYER 8000 | 8020 | 8040 | 8060 | 8080 | 8100 | 8120 | 8140 | 8160 | 8180 | 8200 | 8220 |
|---|---|---|---|---|---|---|---|---|---|---|---|---|
| 8000 | 58 | 46 | 24 | 16 | 13 | 10 | 9 | 14 | 18 | 16 | 14 | 13 |
| 8050 | 19 | 19 | 19 | 16 | 13 | 10 | 9 | 8 | 7 | 6 | 5 | 5 |
| 8100 | 10 | 10 | 10 | 10 | 10 | 10 | 9 | 8 | 7 | 6 | 5 | 5 |
| 8150 | 18 | 7 | 7 | 7 | 7 | 7 | 7 | 13 | 16 | 6 | 5 | 5 |
| 8200 | 14 | 10 | 5 | 5 | 5 | 5 | 5 | 5 | 5 | 10 | 14 | 10 |
| 8250 | 11 | 9 | 4 | 4 | 4 | 4 | 4 | 4 | 4 | 4 | 4 | 4 |
| 8300 | 16 | 8 | 4 | 4 | 4 | 4 | 4 | 8 | 9 | 4 | 4 | 4 |
| 8350 | 13 | 7 | 4 | 3 | 3 | 3 | 3 | 3 | 5 | 8 | 3 | 3 |
| 8400 | 13 | 10 | 6 | 3 | 3 | 3 | 3 | 3 | 3 | 4 | 8 | 5 |
| 8450 | 15 | 8 | 5 | 3 | 3 | 3 | 3 | 6 | 7 | 3 | 3 | 7 |
| 8500 | 13 | 9 | 6 | 3 | 3 | 3 | 3 | 3 | 6 | 5 | 3 | 3 |
| 8550 | 14 | 9 | 5 | 3 | 2 | 2 | 2 | 3 | 2 | 6 | 4 | 2 |
| 8600 | 14 | 9 | 4 | 3 | 2 | 2 | 2 | 5 | 4 | 3 | 5 | 3 |
| 8650 | 13 | 8 | 4 | 3 | 2 | 2 | 2 | 2 | 5 | 2 | 4 | 5 |
| 8700 | 15 | 7 | 5 | 3 | 3 | 2 | 2 | 4 | 3 | 5 | 2 | 5 |
| 8750 | 15 | 11 | 5 | 4 | 4 | 2 | 2 | 3 | 4 | 4 | 4 | 2 |
| 8800 | 17 | 10 | 6 | 4 | 4 | 2 | 2 | 2 | 5 | 3 | 5 | 3 |
| 8850 | 15 | 8 | 5 | 3 | 3 | 2 | 2 | 4 | 4 | 4 | 4 | 4 |
| 8900 | 14 | 7 | 4 | 3 | 3 | 3 | 2 | 3 | 4 | 4 | 2 | 4 |
| 8950 | 14 | 9 | 5 | 4 | 3 | 3 | 2 | 2 | 4 | 3 | 4 | 4 |
| 9000 | 11 | 8 | 5 | 4 | 4 | 4 | 2 | 3 | 4 | 4 | 3 | 3 |
| 9050 | 15 | 9 | 5 | 2 | 2 | 2 | 2 | 2 | 4 | 3 | 2 | 3 |
| 9100 | 14 | 10 | 5 | 4 | 2 | 2 | 2 | 1 | 2 | 3 | 3 | 3 |
| 9150 | 14 | 7 | 4 | 3 | 2 | 2 | 2 | 4 | 3 | 4 | 2 | 3 |
| 9200 | 15 | 9 | 4 | 3 | 2 | 2 | 2 | 3 | 4 | 3 | 2 | 3 |
| 9250 | 15 | 10 | 5 | 4 | 2 | 2 | 2 | 3 | 3 | 2 | 3 | 3 |
| 9300 | 16 | 9 | 5 | 3 | 2 | 2 | 1 | 2 | 3 | 2 | 3 | 2 |
| 9350 | 16 | 8 | 4 | 3 | 3 | 2 | 2 | 3 | 4 | 3 | 2 | 3 |
| 9400 | 15 | 9 | 4 | 3 | 3 | 2 | 2 | 3 | 4 | 3 | 2 | 3 |
| 9450 | 16 | 9 | 5 | 3 | 2 | 2 | 2 | 3 | 4 | 2 | 3 | 3 |
| 9500 | 14 | 10 | 5 | 4 | 3 | 2 | 2 | 3 | 3 | 4 | 3 | 3 |
| 9550 | 15 | 7 | 4 | 2 | 2 | 2 | 2 | 2 | 3 | 3 | 3 | 2 |
| 9600 | 12 | 9 | 4 | 3 | 2 | 2 | 2 | 3 | 5 | 3 | 2 | 3 |

FIG. 22

IMAGE EXPOSURE DEVICE

CROSS-REFERENCE TO RELATED APPLICATIONS

The present application is a Continuation of PCT International Application No. PCT/JP2018/034418 filed on Sep. 18, 2018 claiming priorities under 35 U.S.C. § 119(a) to Japanese Patent Application No. 2017-182925 filed on Sep. 22, 2017. Each of the above applications is hereby expressly incorporated by reference, in its entirety, into the present application.

BACKGROUND OF THE INVENTION

1. Field of the Invention

The present invention relates to an image exposure device and particularly to an image exposure device that selects, in light radiated from a light source, light parallel to a photosensitive recording medium for recording an image and carries out exposure using the light.

2. Description of the Related Art

For the exposure of photographs, photomasks, or the like, optical systems for projecting that are optical systems of an imaging system are being used. However, in the case of the optical systems for projecting, an optical system such as a lens is required between an image and a photosensitive material, and a large volume becomes necessary. In the case of exposing a pattern of a semiconductor or the like using a photomask, the photomask is adhered or almost adhered to the photosensitive material. At this time, a space or a protective plate is provided between the photosensitive material and a mask pattern, and parallel light is projected, thereby preventing the blurring of the image.

In addition, in light radiated from a light source, light radiated parallel to the photosensitive material is used to irradiate and expose the photosensitive material, thereby preventing the blurring of the image. For example, in U.S. Pat. No. 9,126,396B, an optical fiber array or the like is installed between a photosensitive material and a light-emitting image such as an electron display, and, in light radiated from the display toward the photosensitive material, only light parallel to the photosensitive material from the display is selected (collimated) and radiated to the photosensitive material, whereby the photosensitive material can be exposed without blurring the light-emitting image.

SUMMARY OF THE INVENTION

However, in a printing device described in U.S. Pat. No. 9,126,396B, an optical system becomes large, and thus the entire device increases in size, which creates a desire for decreasing the size of the device.

The present invention has been made in consideration of the above-described circumstance, and an object of the present invention is to provide an image exposure device capable of recording a favorable image using only light parallel to a photosensitive recording medium from an image display device and capable of decreasing the size of the device.

In order to attain the above-described object, the present invention provides an image exposure device comprising an image display device having pixels; a photosensitive recording medium support portion that supports a photosensitive recording medium for recording an image of the image display device in a state in which an exposure surface of the photosensitive recording medium faces the image display device; and a transmitted light control portion that is provided between the image display device and the photosensitive recording medium support portion and is formed by laminating three or more layers of transmission members that have a plurality of openings formed therein and transmit only light incident on the openings.

According to the present invention, three or more layers of transmission members having a plurality of openings formed therein are laminated together as the transmitted light control portion between the image display device and the photosensitive recording medium support portion, whereby it is possible to decrease the probability of light incident in a direction oblique with respect to the transmission member passing through the openings in a second layer and a third layer of the transmission members even in the case of passing through the openings in a first layer. Therefore, the light incident in an oblique direction can be blocked using the transmitted light control portion, and thus it is possible to radiate, in light radiated from the image display device, only light parallel to a direction toward the photosensitive recording medium to the photosensitive recording medium. An image can be recorded in the photosensitive recording medium using only the light parallel to the photosensitive recording medium, and thus it is possible to form a favorable image that is not blurred. In addition, only parallel light is selected using the transmitted light control portion formed by laminating the transmission members, whereby the necessity for a large optical system can be removed, and it is possible to decrease the size of the device.

In a different aspect of the present invention, the plurality of openings is preferably formed to be identical in size and location among the plurality of the laminated transmission members.

According to this aspect, the plurality of openings is formed to be identical in size and location among the plurality of the laminated transmission members, whereby, in the light radiated from the image display device, it is possible to facilitate the passing of only the light parallel to the photosensitive recording medium. Here, the plurality of openings may be substantially identical in size and location. Specifically, regarding the size of the opening, there may be an error in size of 5% or less of the size of the opening, and, regarding the location of the opening, there may be an error in distance of 5% or less of the distance between a plurality of adjacent openings. Furthermore, the distance between a plurality of adjacent openings refers to a distance between the centers of gravity of the openings connected using a straight line.

In a different aspect of the present invention, the transmitted light control portion preferably further includes at least any one selected from a slit, a fiber optic plate, or a capillary plate.

According to this aspect, the transmitted light control portion includes, in addition to the three or more layers of the transmission members, furthermore, the above-described member, whereby it is possible to select, in the light radiated from the image display device, only light parallel to the photosensitive recording medium. Therefore, it is possible to form a favorable image that is not blurred.

In a different aspect of the present invention, a distance between the image display device and the transmission member closest to the image display device is preferably equal to or more than a pixel pitch of the image display device.

This aspect defines the lower limit of the distance between the image display device and the transmission member, and the lower limit of the distance between the image display device and the transmission member is set to be equal to or more than the pixel pitch, whereby it is possible to block the light radiated from the image display device in a broader angle. Therefore, it is possible to increase the degree of freedom in the disposition of the second layer of the transmission member and the third layer of the transmission member. The pixel pitch refers to a distance between a plurality of pixels arrayed on the image display device.

In a different aspect of the present invention, a distance between the image display device and the transmission member closest to the image display device is preferably equal to or less than 100 times a pixel pitch of the image display device.

This aspect defines the upper limit of the distance between the image display device and the transmission member. The upper limit of the distance between the image display device and the transmission member is set to be equal to or less than 100 times the pixel pitch, whereby it is possible to block light obliquely radiated from the image display device using the first layer of the transmission member. In a case where the distance between the image display device and the transmission member is set to be long, an angle at which, in light radiated from the image display device, obliquely radiated light is blocked using the transmission member becomes narrow, and thus it is necessary to allow only parallel light to pass through the transmission member using the distances at which the second and third layers of the transmission members are disposed.

In a different aspect of the present invention, among the plurality of transmission members, a distance between the transmission member closest to the image display device and the transmission member farthest from the image display device is preferably equal to or less than 100 times a distance of a pixel pitch of the image display device.

This aspect defines a thickness of the transmitted light control portion that is configured with the plurality of transmission members, and the thickness is set to be equal to or less than 100 times the distance of the pixel pitch, whereby it is possible to block oblique light using the second and third layers of the transmission members. Therefore, it is possible to record a favorable image.

In a different aspect of the present invention, the number of the layers of the transmission members is preferably eight or less.

This aspect defines the upper limit of the number of the layers of the transmission members, and up to eight layers of the transmission members are laminated together, whereby light obliquely radiated from the image display device can be reliably blocked, and it is possible to record a favorable image.

In a different aspect of the present invention, the transmission member preferably has a location determination hole for determining a location of each of the transmission members in a case of laminating the plurality of transmission members.

According to this aspect, the transmission member has the location determination hole, and the location at which the transmission member is to be laminated is determined using the location determination hole, whereby it is possible to align locations of the openings provided in the transmission members in a light-travelling direction. Therefore, it is possible to transmit, in the light radiated from the image display device, only light parallel to a lamination direction of the transmission members, and a favorable image can be recorded.

In a different aspect of the present invention, at least one of distances between adjacent transmission members is preferably different from other distances between the transmission members.

According to this aspect, among the plurality of transmission members, the distance between adjacent transmission members is made to be different from other distances between the transmission members, whereby it is possible to reliably block light that has obliquely passed through the first layer and the second layer using the third layer.

In a different aspect of the present invention, it is preferable that the image display device has two-dimensionally arrayed pixels, and the image exposure device exposes an entire two-dimensional region of the exposure surface of the photosensitive recording medium at the same time.

In a different aspect of the present invention, it is preferable that the image display device has one-dimensionally arrayed pixels, and the image exposure device further comprises scanning means for scanning at least any one of the image display device or the photosensitive recording medium supported by the photosensitive recording medium support portion along a direction perpendicular to an array direction of the pixels of the image display device.

In a different aspect of the present invention, it is preferable that the image display device has two-dimensionally arrayed pixels on a region having a smaller area than the exposure surface of the photosensitive recording medium, and the image exposure device further comprises scanning means for scanning at least any one of the image display device or the photosensitive recording medium supported by the photosensitive recording medium support portion along an array direction of the pixels of the image display device and a direction perpendicular to the array direction of the pixels.

These aspects show an aspect of a device for exposing the photosensitive recording medium to an image of the image display device. As an exposure device, the entire surface may be collectively exposed or an image can be recorded in the entire region of the photosensitive recording medium by using an image display device having a smaller area than the exposure surface of the photosensitive recording medium and scanning the image display device.

In a different aspect of the present invention, among exposure ranges by light from the pixels on a location at which the exposure surface of the photosensitive recording medium is supported, adjacent exposure ranges preferably partially overlap each other.

According to this aspect, the photosensitive recording medium is exposed while adjacent exposure ranges are partially overlapped together, whereby it is possible to avoid the generation of a non-exposure region on the photosensitive recording medium and a state in which an image is not formed.

According to the image exposure device of the present invention, it is possible to block oblique light from the image display device using the transmission member. Therefore, it is possible to record an image in the photosensitive recording medium using, in light radiated from the image exposure device, only light parallel to a direction toward the photosensitive recording medium, and thus a favorable image can be recorded in the photosensitive recording medium.

BRIEF DESCRIPTION OF THE DRAWINGS

FIG. 16 is a table of results obtained by simulation of the numbers of light rays that have passed through openings.

FIG. 17 is a table of the results obtained by simulation of the numbers of light rays that have passed through the openings.

FIG. 18 is a table of the results obtained by simulation of the numbers of light rays that have passed through the openings.

FIG. 19 is a table of the results obtained by simulation of the numbers of light rays that have passed through the openings.

FIG. 20 is a table of the results obtained by simulation of the numbers of light rays that have passed through the openings.

FIG. 21 is a table of the results obtained by simulation of the numbers of light rays that have passed through the openings.

FIG. 22 is a table of the results obtained by simulation of the numbers of light rays that have passed through the openings.

DESCRIPTION OF THE PREFERRED EMBODIMENTS

Hereinafter, an image exposure device according to an embodiment of the present invention will be described according to the accompanying drawings.

(Image Exposure Device)

Figure 1:
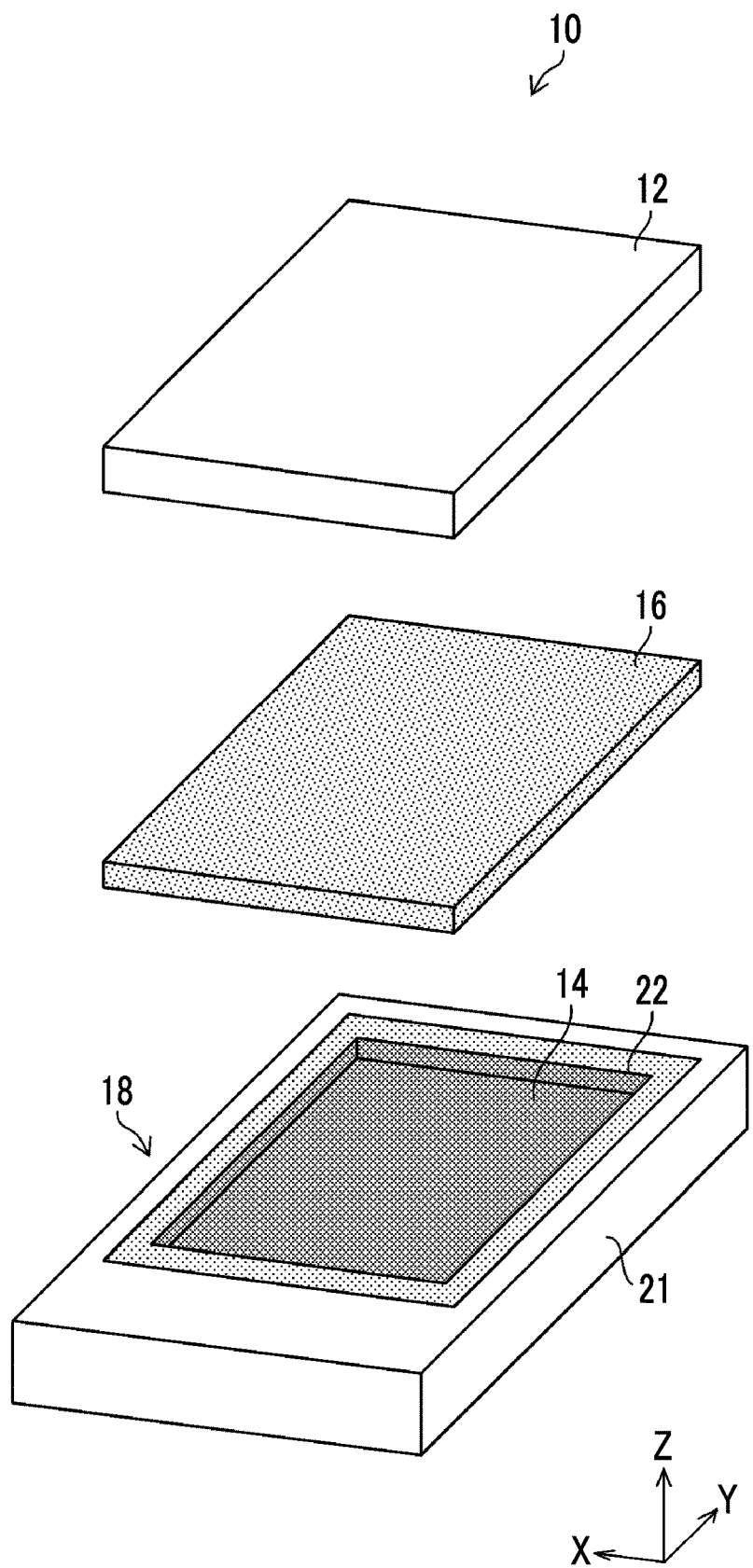
FIG. 1 is an exploded perspective view of an image exposure device.
Figure 2:
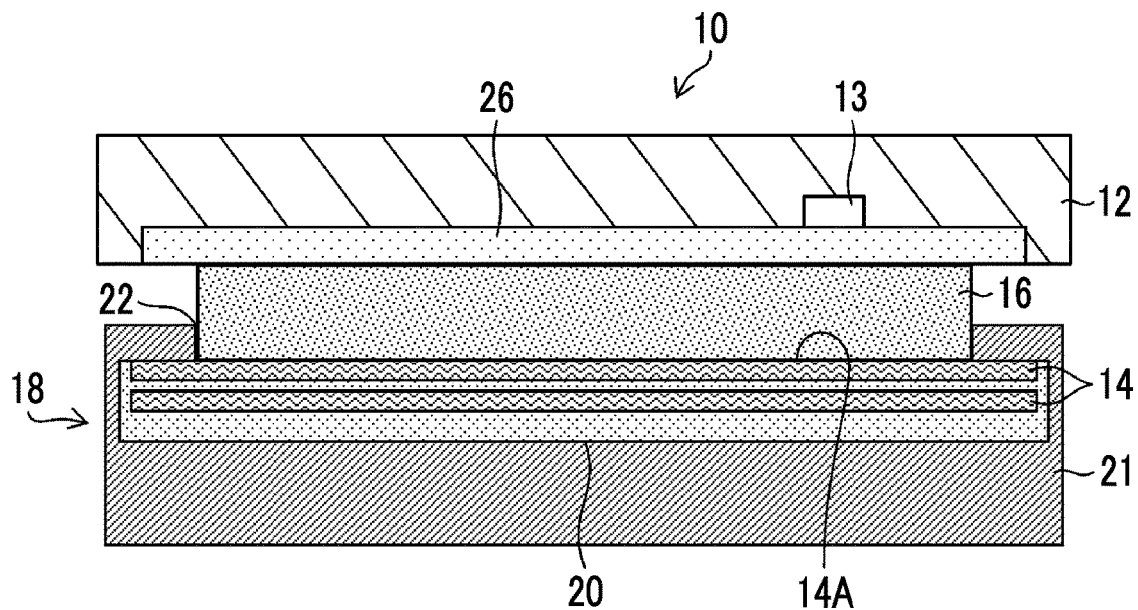
FIG. 2 is a cross-sectional view of the image exposure device.

An image exposure device to which the present invention is applied will be described using FIG. 1 and FIG. 2. FIG. 1 is an exploded perspective view of the image exposure device, and FIG. 2 is a cross-sectional view of the image exposure device.

An image exposure device 10 in the drawings has an image display device 12 having pixels 13, a photosensitive recording medium support portion 21 that supports a photosensitive recording medium 14 for recording an image of the image display device 12, and a transmitted light control portion 16 formed by laminating three or more layers of transmission members (indicated by a reference 100 in FIG. 3) that has a plurality of openings (indicted by a reference 102 in FIG. 3) formed therein and transmits only light incident on the openings between the image display device 12 and the photosensitive recording medium support portion 21 that supports the photosensitive recording medium 14.

[Image Display Device]

As the image display device 12, it is possible to use a portable terminal such as a smartphone or a tablet PC, a liquid crystal display (LCD), a cathode ray tube (CRT), a light emitting diode (LED), a plasma display device, or the like. The image display device 12 includes a plurality of pixels 13 (in FIG. 2, one pixel is shown as an example) for displaying an image. The pixel 13 refers to a minimum unit of color information configuring an image display surface. The image display device 12 has the pixels 13 and is thus capable of displaying an image.

On a surface side on which light is radiated from the image display device 12, a glass window 26 is provided. A distance between the image display device 12 and the transmission member 100 in the transmitted light control portion 16 becomes a distance including a thickness of the glass window 26. Therefore, in the case of designing a distance to a first layer of the transmission member 100 from the image display device 12, the above-described fact needs to be considered.

The pixel 13 needs to have a function capable of radiating any light from the image display device 12, and a lamp is not essential. The image display device 12 refers, for example, not only to a case where a lamp such as a backlight radiates light as in a liquid crystal display but also to a case where the image display device radiates light on its own as in a light-emitting diode display device.

A pixel display surface of the image display device 12 shown in FIGS. 1 and 2 has two-dimensionally arrayed pixels 13. Being two-dimensional means a state in which the pixels extend in X-Y directions.

Figure 4:
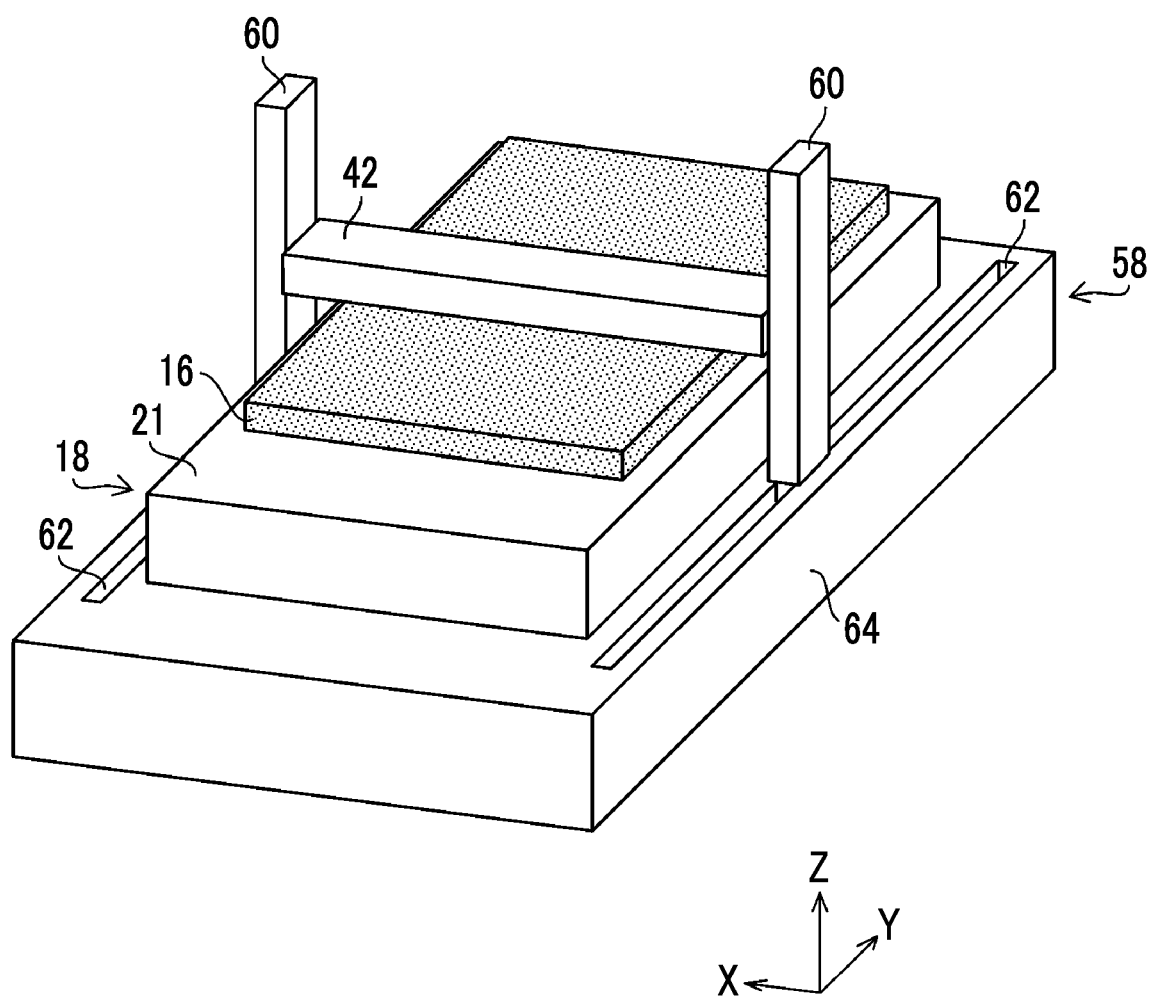
FIG. 4 is a perspective view of an image exposure device of another embodiment.
Figure 5:
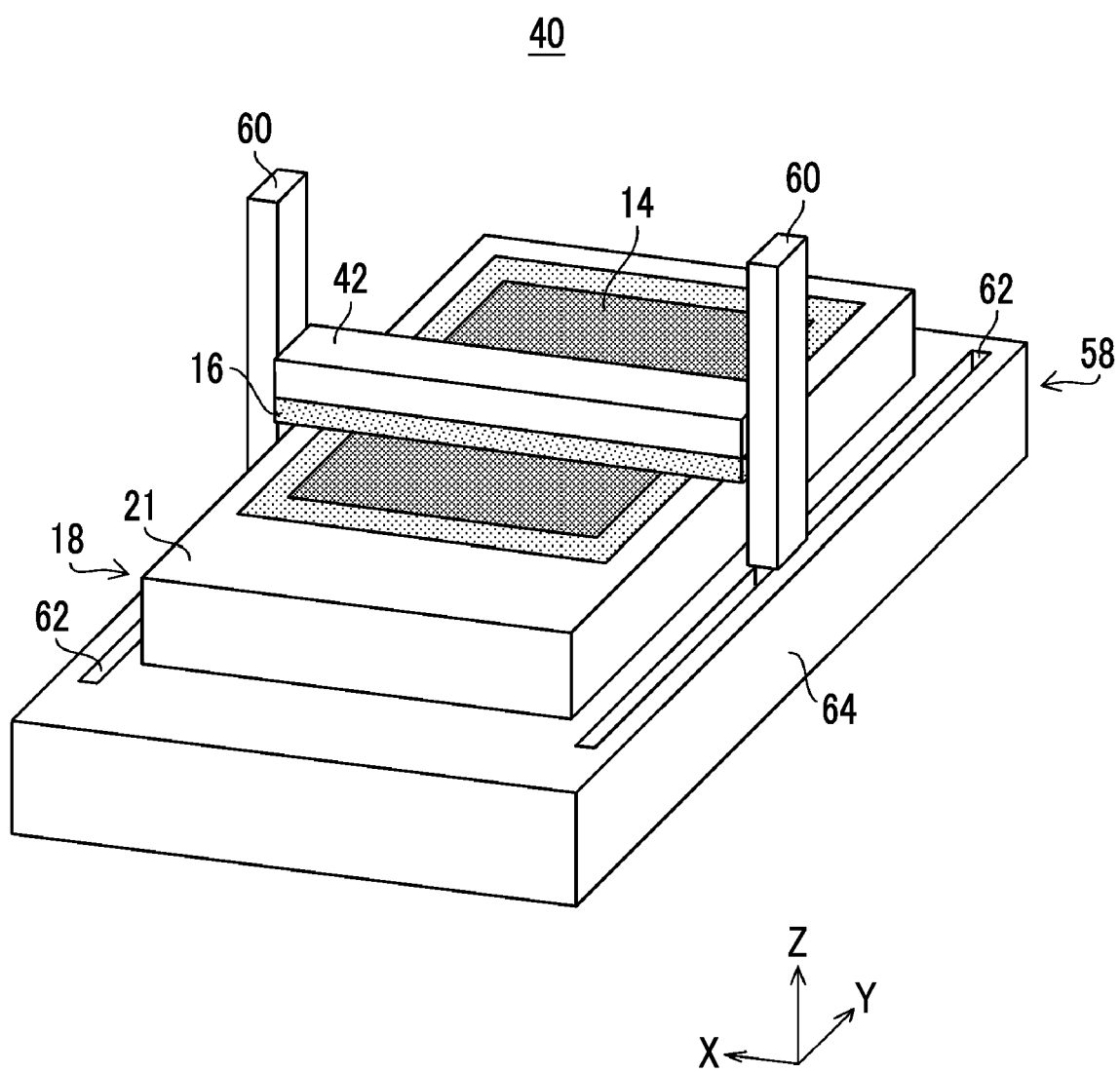
FIG. 5 is a perspective view showing a modification example of the image exposure device of the other embodiment.

The pixels 13 of the image display device can also be one-dimensionally arrayed as shown in FIGS. 4 and 5.

[Photosensitive Recording Medium Support Portion]

The photosensitive recording medium support portion 21 supports the photosensitive recording medium 14 so that the photosensitive recording medium 14 is disposed at a location facing a surface of the image display device 12 from which light is radiated. The photosensitive recording medium support portion 21 may directly or indirectly support the photosensitive recording medium 14, and the structure thereof is not particularly limited as long as the photosensitive recording medium support portion is capable of supporting the photosensitive recording medium 14.

[Photosensitive Recording Medium]

The photosensitive recording medium 14 has an exposure surface 14A. The photosensitive recording medium 14 is not particularly limited as long as the photosensitive recording medium can be exposed by light radiated from the image display device 12 and is capable of forming an image. For example, it is possible to use a film pack 18 which is loaded into an instant camera (for example, manufactured by Fujifilm Corporation, Cheki).

The film pack 18 is formed by incorporating the photosensitive recording medium 14 into a case 20. Between a plurality of the photosensitive recording media 14 provided in the case 20, a light-blocking sheet, not shown, is provided, and, due to this light-blocking sheet, only the photosensitive recording medium 14 present on the uppermost surface of the film pack 18 is exposed. As a material used for the photosensitive recording medium 14, for example, photographic sensitive materials such as a negative film, a reversal film, printing paper, and a mono-sheet or peel-apart type instant photographic film can be exemplified.

As shown in FIG. 2, a plurality of the photosensitive recording media 14 is packed in a box-like case 20 having a light-blocking property. In the case 20, an exposure opening 22 that passes light radiated from the image display device 12 through is provided in order to expose the exposure surface of the photosensitive recording medium 14. In addition, on a side opposite to the exposure opening 22, a pressing member (not shown) is provided, and the photosensitive recording medium 14 is pressed toward the exposure opening 22 using the pressing member. Therefore, the photosensitive recording medium 14 is pressed in the circumference of the exposure opening 22, the distance with the image display device 12 becomes close, and a favorable image can be recorded in the photosensitive recording medium 14.

As the case 20, it is possible to use a resin member for a recording material that is used for a variety of recording materials such as a photographic sensitive material, a magnetic recording material, and an optical recording material, and the resin member for a recording material refers to a case, a lid, and an accessory supplemented thereto which are used to contain, pack, coat, protect, transport, store, or support (the form of) the recording material or a variety of members that mount the recording material and exhibit a function.

The exposed photosensitive recording medium 14 is passed through between delivery rollers (not shown), whereby a pod portion provided in the photosensitive recording medium breaks. In the pod portion, a development process liquid is encapsulated, and the breakage of the pod portion causes the development process liquid to spread in the photosensitive recording medium 14. After one to several minutes elapses, a development process is completed, and an image is formed on the photosensitive recording medium 14.

[Transmitted Light Control Portion]

Figure 3:
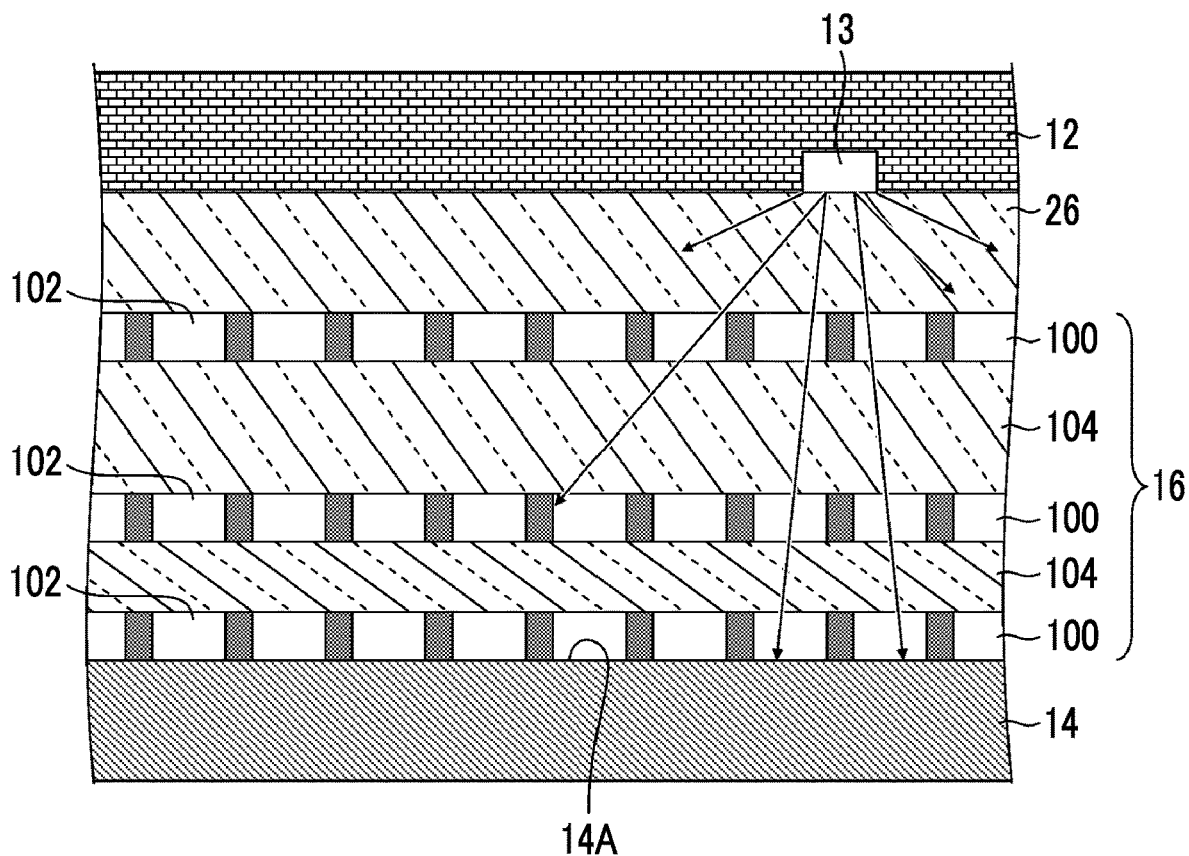
FIG. 3 is a schematic cross-sectional view of the image exposure device showing a transmitted light control portion.

FIG. 3 is a schematic cross-sectional view of the image exposure device showing the transmitted light control portion in detail. The transmitted light control portion 16 is formed by laminating three or more layers of the transmission members 100 having a plurality of openings 102 formed therein. At least three layers of the transmission members 100 are laminated together, whereby it is possible to allow, in light radiated from the pixels 13 of the image display device, only parallel light to reach the exposure surface 14A of the photosensitive recording medium 14. Light incident obliquely on the opening 102 is blocked by any transmission member 100 among the plurality of transmission members 100 and is thus not capable of reaching the exposure surface 14A of the photosensitive recording medium 14. As described above, an image is recorded in the photosensitive recording medium 14 only using parallel light from the image display device 12, whereby a favorable image can be recorded. Meanwhile, the transmitted light control portion 16 will be described below.

In the image exposure device 10 shown in FIG. 1, the pixels 13 are two-dimensionally arrayed to extend in the X-Y directions on the image display device 12, and the image display surface of the image display device 12 is set to be larger than the sizes of the transmitted light control portion 16 and the exposure opening 22 of the film pack 18. The size of the exposure opening 22 becomes an exposure area of the photosensitive recording medium 14. Therefore, it is possible to expose an image from the image display device 12 on the entire exposure surface of the photosensitive recording medium 14 at the same time. An image needing to be exposed is displayed on the image display device 12. Light from the pixels 13 of the image display device 12 passes through the transmitted light control portion 16 and turns into parallel light. This parallel light reaches the photosensitive recording medium 14 and can be used to expose the entire exposure surface of the photosensitive recording medium at the same time. The image display surface of the image display device 12 is set to be equal to or larger than the exposure area of the photosensitive recording medium, whereby it is possible to expose an image without providing scanning means described below. In addition, it is possible to provide room for margin of the installation location accuracy at the time of incorporating the image display device 12 into the photosensitive recording medium support portion 21.

FIG. 4 is a view showing an image exposure device 40 of another embodiment. The pixels 13 of an image display device 42 in the image exposure device 40 are one-dimensionally arrayed. Being one-dimensional means a state in which the pixels extend in one direction of the X-Y directions. As shown in FIG. 4, the image display device 42 is disposed at a location at which the image display device extends in the X direction, and the plurality of pixels 13 of the image display device 42 is also one-dimensionally arrayed.

The image display device 42 is almost as long as the length in the X direction of the photosensitive recording medium 14. The array of the pixels 13 of the image display device 42 is one-dimensional, and thus the length of the image display device 42 in the Y direction is shorter than the length of the photosensitive recording medium 14. That is, the image display device 42 is smaller than the exposure surface of the photosensitive recording medium 14.

In the image exposure device 40 shown in FIG. 4, the image display device 42 is scanned in a direction (Y direction) perpendicular to the array direction of the pixels 13 in order to expose the photosensitive recording medium 14.

As shown in FIG. 4, the image exposure device 40 includes scanning means 58 for scanning the image display device 42. The scanning means 58 includes support members 60 that support the image display device 42, a support table 64 that supports the film pack 18, and a driving portion (not shown) that is accommodated in the support table 64. The support table 64 includes rails 62, and the driving portion is capable of scanning the support members 60 in the Y direction along the rails 62.

The scanning means 58 scans the image display device 42 in the Y direction, whereby the image display device 42 is capable of sequentially exposing the photosensitive recording medium 14. Light from the pixels of the image display device 42 passes through the transmitted light control portion 16 and turns into parallel light. This parallel light reaches the photosensitive recording medium 14 and can be used to sequentially expose the photosensitive recording medium.

FIG. 5 is a view showing a modification example of the image exposure device 40 shown in FIG. 4. In the modification example of the image display device 42, the transmitted light control portion 16 is configured one-dimensionally so as to extend in the X direction like the pixels 13 of the image display device 42.

The scanning means 58 scans the image display device 42 and the transmitted light control portion 16 in the Y direction that is a direction perpendicular to the array direction of the pixels of the image display device 42, whereby the image display device 42 is capable of sequentially exposing the photosensitive recording medium 14. Light from the pixels of the image display device 42 passes through the transmitted light control portion 16 and turns into parallel light. This parallel light reaches the photosensitive recording medium 14 and can be used to sequentially expose the photosensitive recording medium.

The case where the image exposure device 40 shown in FIG. 4 and FIG. 5 exposes the photosensitive recording medium while scanning the image display device 42 has been described, but the photosensitive recording medium may be exposed while scanning the photosensitive recording medium as long as the image display device 42 and the photosensitive recording medium 14 can be relatively scanned.

Figure 6:
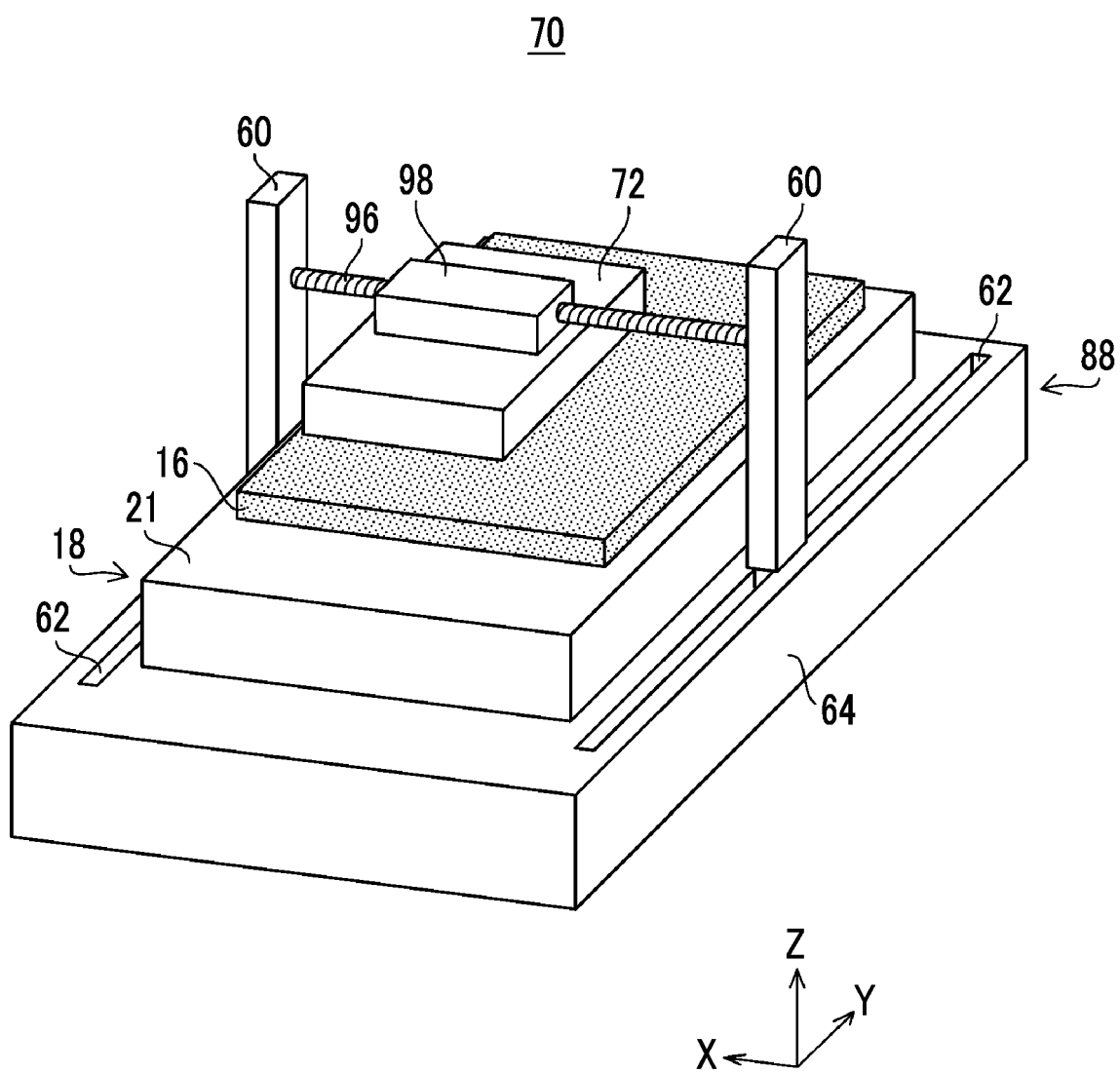
FIG. 6 is a perspective view of an image exposure device of still another embodiment.

FIG. 6 is a view showing an image exposure device 70 of still another embodiment. In the image exposure device 70, the pixels 13 of an image display device 72 are two-dimensionally arrayed in a region smaller than the area of the exposure surface of the photosensitive recording medium 14. The image exposure device 70 includes scanning means 88 that scans the image display device 72 not only in the Y direction but also in the X direction.

The scanning means 88 includes a ball screw 96 and a movement portion 98 including a nut that is engaged with the ball screw 96. The movement portion 98 is capable of moving in the X direction by the rotary motion of the ball screw 96. The movement portion 98 preferably has a holding portion (not shown) for holding the image display device 72. In addition, the movement portion can be caused to move in the Y direction using the same method as in the image exposure device 40.

The scanning means 88 scans the image display device 72 in the X direction and the Y direction, whereby the image display device 72 is capable of sequentially exposing the exposure surface of the photosensitive recording medium 14. Light from the pixels of the image display device 72 passes through the transmitted light control portion 16 and turns into parallel light. This parallel light reaches the exposure surface of the photosensitive recording medium 14 and can be used to sequentially expose the photosensitive recording medium.

The image exposure device 70 can be effectively applied to the case of exposing the photosensitive recording medium 14 that is larger than the image display device 72.

Figure 7:
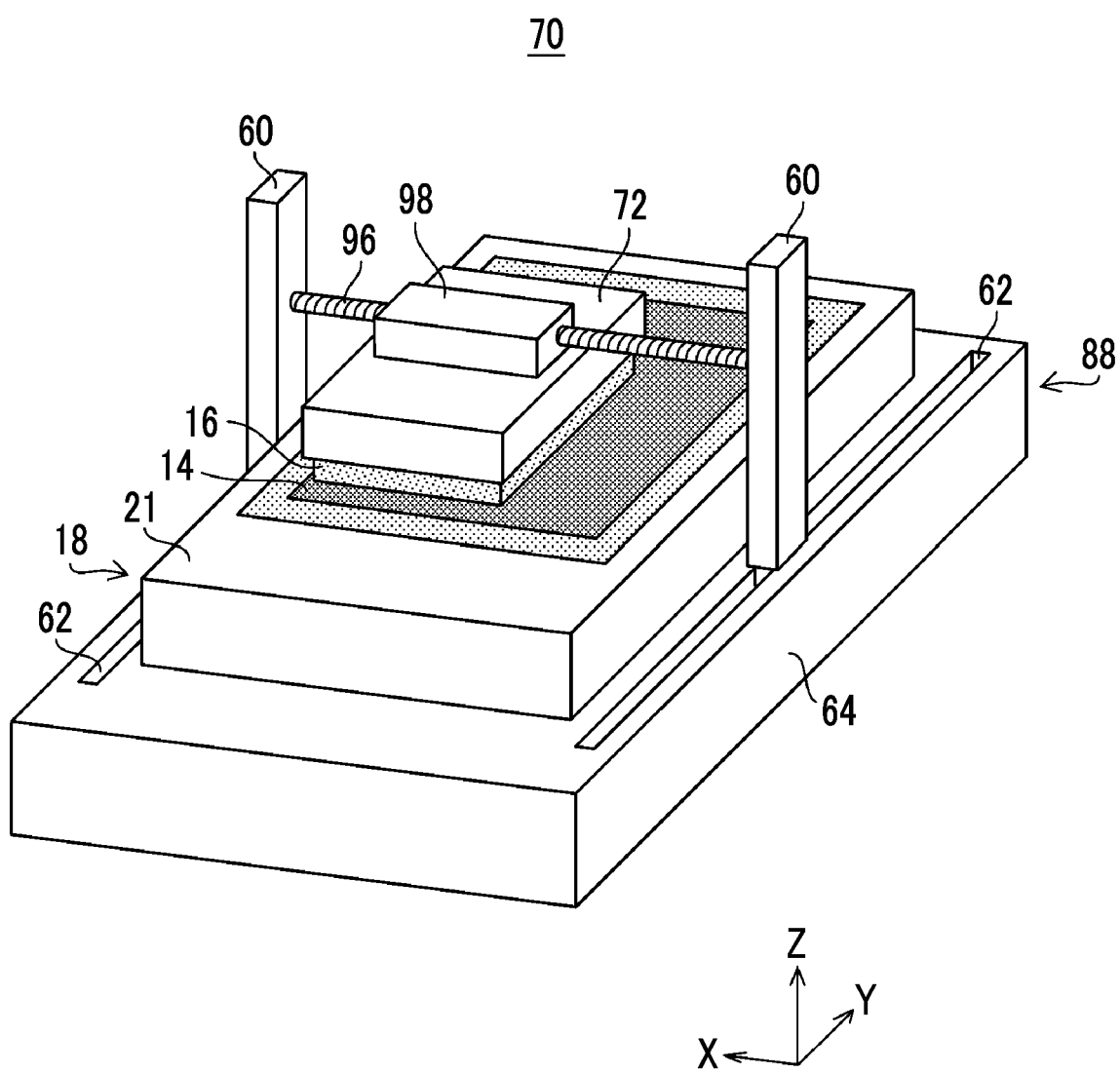
FIG. 7 is a perspective view showing a modification example of the image exposure device of the still other embodiment.

FIG. 7 is a view showing a modification example of the image exposure device 70 shown in FIG. 6. In the modification example of the image exposure device 70, a main surface of the transmitted light control portion 16 becomes a two-dimensional region having a smaller area than the photosensitive recording medium 14 like the region in which the pixels 13 of the image display device 72 are arrayed.

The scanning means 88 scans the image display device 72 and the transmitted light control portion 16 in the X and Y directions, whereby the image display device 72 is capable of sequentially exposing the exposure surface of the photosensitive recording medium 14. Light from the pixels of the image display device 72 passes through the transmitted light control portion 16 and turns into parallel light. This parallel light reaches the photosensitive recording medium 14 and can be used to sequentially expose the photosensitive recording medium.

The case where the image exposure device 70 shown in FIG. 6 and FIG. 7 exposes the photosensitive recording medium while scanning the image display device 72 has been described, but the photosensitive recording medium may be exposed while scanning the photosensitive recording medium 14 in the X direction and the Y direction as long as the image display device 72 and the photosensitive recording medium 14 can be relatively scanned.

In the image exposure device 40 and the image exposure device 70, the image display device is smaller than the photosensitive recording medium. Among exposure ranges by light from the pixels of the image display device on a location at which the exposure surface of the photosensitive recording medium is supported, adjacent exposure ranges may partially overlap each other. In the case of preventing the partial overlapping of the exposure ranges, there is a concern that a non-exposure region may be generated on the photosensitive recording medium. A state in which no image is formed on the photosensitive recording medium which is attributed to the non-exposure region is preferably avoided.

<Transmitted Light Control Portion>

A path of light that passes through the inside of the transmitted light control portion 16 will be described using FIG. 3. The transmitted light control portion 16 is formed by disposing the transmission members 100 having the openings 102 formed therein and spacers 104 between the transmission members 100. The distance between the transmission members 100 is adjusted using the height of the spacer 104 being disposed. In addition, light passes through the spacer 104, and thus a glass material can be used. It is necessary to make the distance between the transmission members 100 adjustable, and it is also possible to provide only an outer frame while leaving the inside empty.

Light radiated from the pixels of the image display device 12 is radiated toward all directions of 180° from the image display surface. The radiated light passes through the glass window 26 provided in the image display device 12 and is incident on the transmitted light control portion 16. In the light incident on the transmitted light control portion 16, only light parallel to a straight line connecting the image display device 12 and the photosensitive recording medium 14 can be caused to pass through the openings 102 of the transmission member 100. In addition, light radiated obliquely with respect to the straight line connecting the image display device 12 and the photosensitive recording medium 14 is blocked by the second layer of the transmission member 100 even in the case of passing through the openings 102 of the first layer of the transmission member 100. In addition, the light is blocked by the third layer of the transmission member 100 even in the case of passing through the openings 102 of the first layer and the second layer of the transmission member 100.

In addition, in a case where the distance of the first layer of the transmission member 100 from the image display device 12 is set to be short, it is possible to block, in light radiated from the pixels 13 of the image display device 12, obliquely radiated light in a broad angle using the first layer of the transmission member 100.

The number of the layers of the transmission members 100 provided in the transmitted light control portion 16 is preferably large since it is possible to block light. However, an excessive increase in the number of the layers does not change the effect and makes the thickness of the transmitted light control portion thick, and thus the number of the layers of the transmission members 100 is preferably set to eight or less, more preferably six or less, and still more preferably four or less.

A material of the transmission member 100 needs to be capable of blocking the passing of light at portions other than the openings 102.

Figure 8:
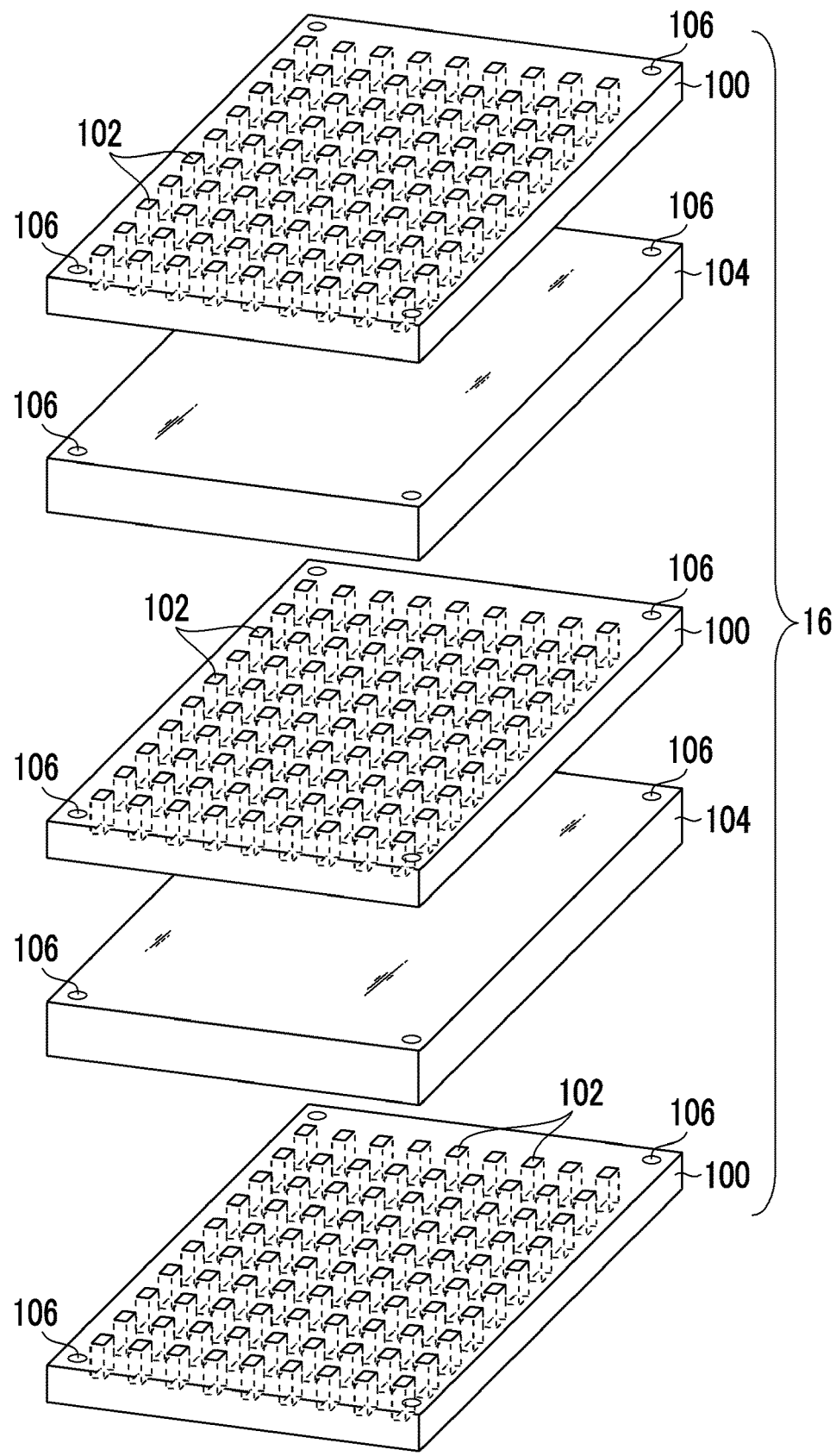
FIG. 8 is an exploded perspective view of the transmitted light control portion.

FIG. 8 is an exploded perspective view of the transmitted light control portion 16. The transmission member 100 has the openings 102 penetrating the transmission member 100 on the entire surface. In addition, in the present embodiment, only parallel light radiated from the image display device 12 is used. Therefore, the locations of the openings 102 of the plurality of transmission members 100 need to be disposed at the same location on a surface perpendicular to a direction connecting the display surface of the image display device 12 and the exposure surface of the photosensitive recording medium 14. Therefore, it is preferable that, in a single transmission member 100, the openings 102 have a constant size and are formed at constant intervals and, furthermore, between the plurality of laminated transmission members 100, the openings 102 have the identical size and are formed at the identical locations. In addition, the transmission member preferably has location determination holes 106 that determine the location of the transmission member 100 so that the locations of the openings 102 become the same at the time of laminating the transmission members 100. In addition, the location of the transmission member 100 is determined by the location determination holes 106, whereby it is possible to prevent the deviation of the transmission member 100 during use.

In addition, the arrangement of the openings 102 of the transmission member 100 can be set to an XY array in which the openings 102 extend in the X-Y directions as shown in FIG. 8. In addition, the arrangement can also be set to a hexagonal dense array (hexagonal lattice array). In a case where the pitches between the openings 102 and the pixel pitches are substantially identical to each other, moire is likely to be generated, and thus the repeating unit array of the openings 102 of the transmission member 100 is arrayed in a direction different from the array direction of the pixels 13 of the image display device 12, whereby it is possible to reduce moire, which is preferable. As a method for differing the array of the openings 102 and the array of the pixels 13, for example, it is possible to differ the array direction of the pixels and the array direction of the openings by setting the image display surface of the image display device 12 and the transmission member relatively obliquely with respect to the horizontal surface.

The size of the opening 102 can be set to, for example, 10 μm. Regarding a preferred range of the size of the opening 102, the lower limit is preferably 1/1,000 or more of the pixel pitch, more preferably 1/100 or more of the pixel pitch, and still more preferably 1/20 or more of the pixel pitch. In addition, the upper limit is preferably 10 times or less the pixel pitch, more preferably five times or less the pixel pitch, still more preferably twice or less the pixel pitch, and most preferably once or less the pixel pitch. In a case where the size of the opening 102 is set to be larger than the above-described lower limit, it is possible to easily process the transmission member. In addition, in a case where the size of the opening 102 is set to be smaller than the above-described upper limit, it is possible to maintain the resolution of the images. In addition, the thickness of one layer of the transmission member 100 can be set to 1 μm.

Figure 9:
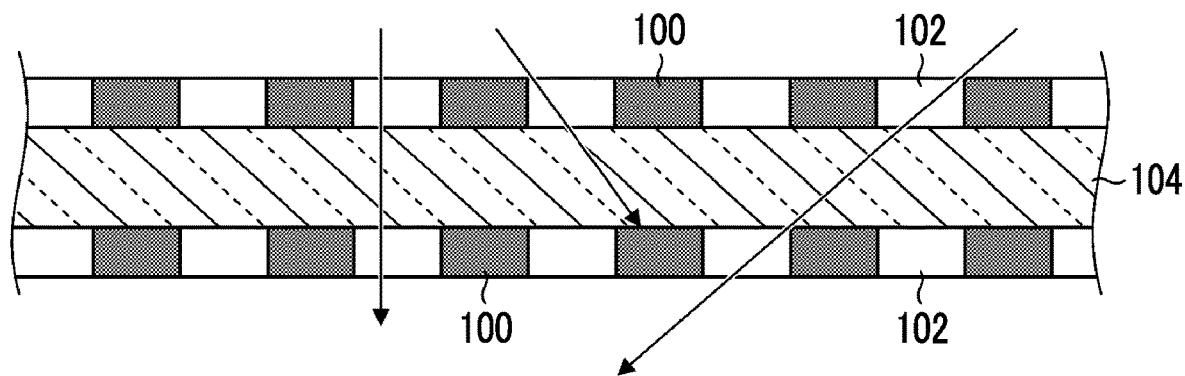
FIG. 9 is a view showing a state of light in the transmitted light control portion.
Figure 10:
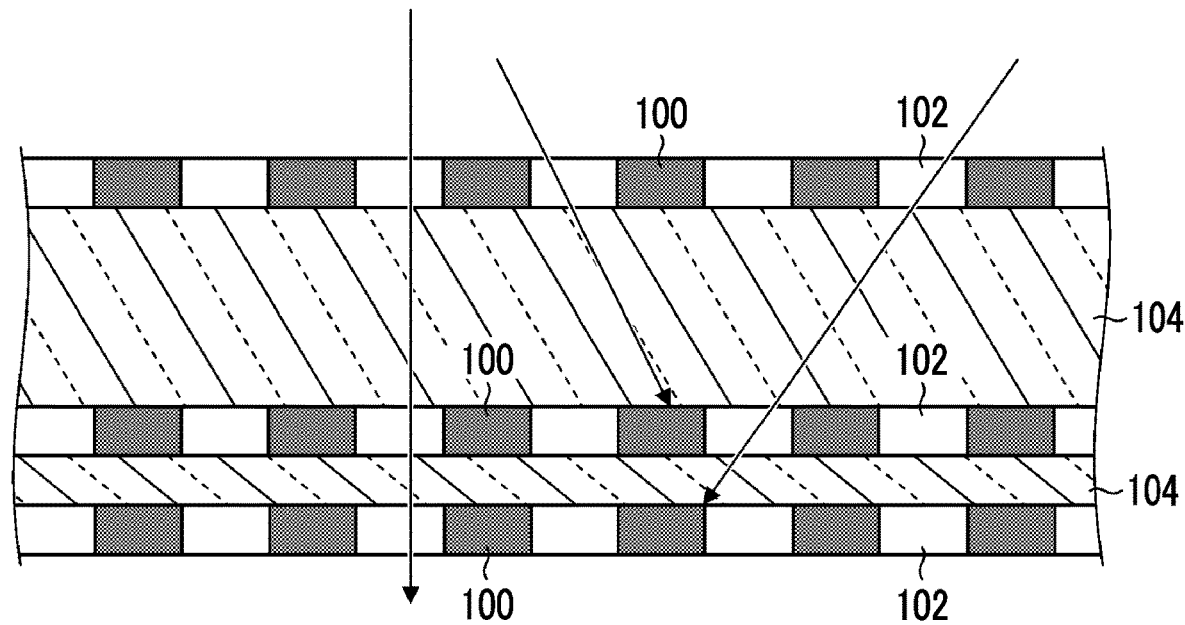
FIG. 10 is a view showing a state of the light in the transmitted light control portion.
Figure 11:
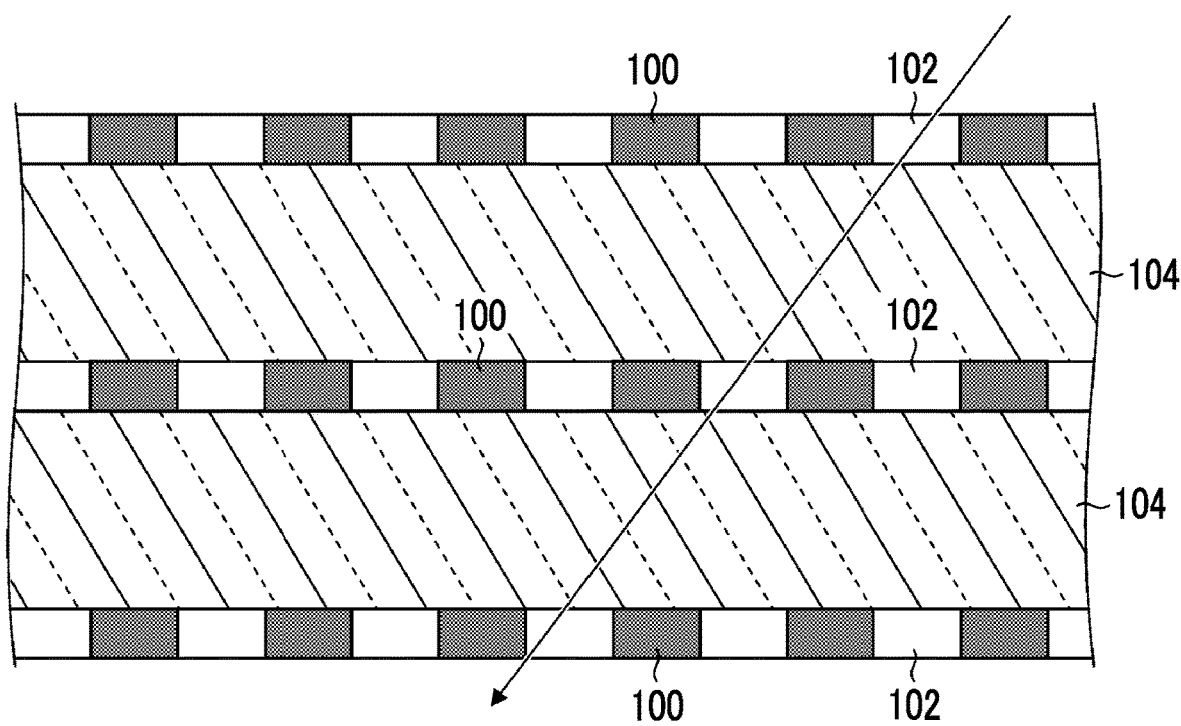
FIG. 11 is a view showing a state of the light in the transmitted light control portion.

FIG. 9 to FIG. 11 are views showing a state of light in the transmitted light control portion depending on the disposition of the transmission member 100. FIG. 9 shows a case where two layers of the transmission members 100 are provided, and, in a case where two layers of the transmission members 100 are provided, obliquely travelling light passes through the transmitted light control portion, and light is likely to leak. In a case where a third layer of the transmission member 100 is added thereto as shown in FIG. 10, it is possible to block light that has passed through the second layer of the transmission member 100 using the third layer of the transmission member 100. In addition, FIG. 11 is a view in which three layers of the transmission members 100 are provided and shows the transmitted light control portion 16 in which the distance between the first layer of the transmission member 100 and the second layer of the transmission member 100 and the distance between the second layer of the transmission member 100 and the third layer of the transmission member 100 are identical to each other. In a case where three layers of the transmission members 100 are provided and the distances between the respective transmission members 100 are identical to each other, light that has passed through the second layer of the transmission member linearly travels as it is and also passes through the third layer of the transmission member. Therefore, in the case of laminating the transmission members 100, it is preferable to dispose the transmission members 100 so that the distances between the respective transmission members differ as shown in FIG. 10.

The distance between the image display device 12 and the transmission member 100 closest to the image display device 12 (the first layer of the transmission member) is preferably equal to or more than the pixel pitch of the image display device 12. In addition, the upper limit is preferably 100 times or less the pixel pitch. The pixel pitch refers to the distance between the plurality of adjacent pixels 13 arrayed on the image display device 12. In FIG. 3, the first layer of the transmission member is disposed in contact with the glass window 26 provided on the image display device 12, but the distance can also be adjusted by providing a spacer between the glass window 26 and the first layer of the transmission member 100. In addition, the distance between the image display device 12 and the transmission member 100 refers to the distance between the pixels 13 of the image display device 12 and the transmission member 100 and, in a case where the glass window 26 is provided, the distance includes a distance as large as the thickness of the glass window 26.

In a case where the distance between the image display device 12 and the transmission member 100 is set to be in the above-described range, it is possible to block light obliquely radiated from the image display device 12, and it is possible to allow, in light radiated from the image display device 12, only light perpendicular to the image display device 12 to pass through the transmitted light control portion. In a case where the distance between the first layer of the transmission member 100 and the image display device 12 is set to be short, it is possible to block, in light radiated from the image display device 12, obliquely radiated light in a broad range. Therefore, it is possible to reduce light that passes through the first layer of the transmission member 100, and, furthermore, in a case where the second layer and the third layer of the transmission member 100 are disposed, it is possible to prevent obliquely radiated light from reaching the photosensitive recording medium 14. In addition, the first layer of the transmission member 100 reduces passing light, whereby it is possible to increase the degree of freedom in the disposition of the second layer and the third layer of the transmission member 100.

In addition, among the plurality of transmission members 100, the distance between the transmission member 100 closest to the image display device 12 and the transmission member 100 farthest from the image display device 12 (in the case of providing three layers, the distance between the first layer of the transmission member and the third layer of the transmission member) is preferably equal to or less than 100 times the pixel pitch. In a case where the thicknesses of the transmission members 100 are set to be in the above-described range, it is possible to shorten the distance between the adjacent transmission members 100. In a case where the distance between the adjacent transmission members 100 is shortened, it is possible to facilitate the blocking of light that has obliquely passed through the openings 102 of the transmission member 100 using the subsequent transmission member 100. In addition, in a case where the distance between the transmission members 100 is shortened, it is possible to suppress the thickness of the transmitted light control portion 16, and it is possible to decrease the size of the entire image exposure device 10.

In addition, the transmitted light control portion 16 can be further provided with, in addition to the transmission member 100, a member that makes light radiated from the image display device 12 into parallel light parallel to the direction of the photosensitive recording medium 14. In a case where the member that makes light into parallel light is provided between the image display device 12 and the transmitted light control portion 16, it is possible to transmit light that has been made into parallel light using the transmitted light control portion 16, and it is possible to record an image in the photosensitive recording medium 14 only using the parallel light, and thus a favorable image can be formed.

As the member that makes light into parallel light, a slit, a fiber optic plate, and a capillary plate can be exemplified, and it is possible to use at least one selected from the above-described members.

The slit (referred to as louver) is configured with a plurality of light transmission portions and a light absorption body for preventing light from reaching an adjacent space. The fiber optic plate is a plate including a plurality of two-dimensionally arrayed optical fibers for transferring light and a glass absorber that absorbs light leaking from the optical fibers. The capillary plate is a plate formed of an aggregate of a plurality of two-dimensionally arrayed capillaries having a hole of several tens of micrometers.

Figure 12:
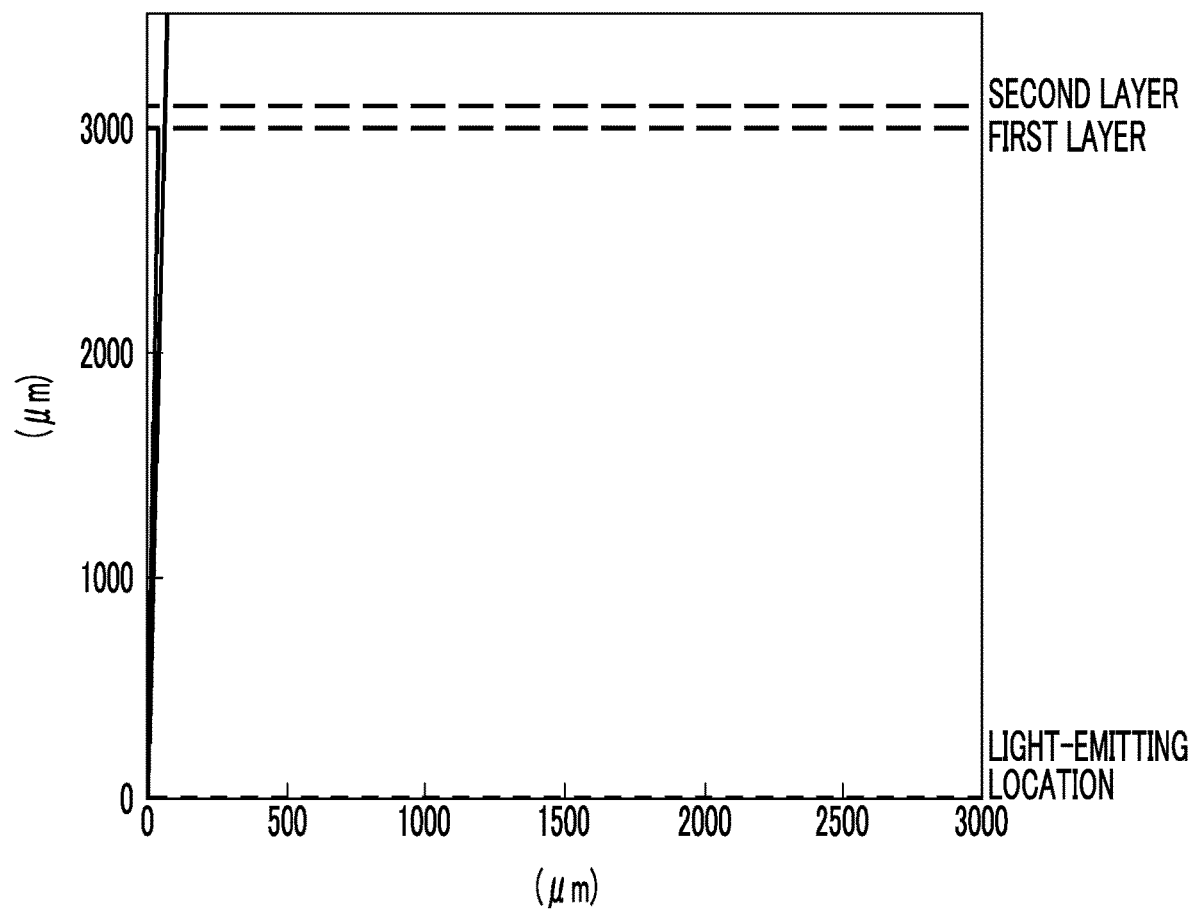
FIG. 12 is a view showing the passing of light by simulation in a case where two layers of transmission members are disposed.

Next, the results of the present invention will be described using simulation. FIG. 12 is a view showing a travelling path of radiated light in a case where two layers of the transmission members are disposed in a graph indicating the location of the openings along the horizontal axis and the locations of the transmission members along the vertical axis from the image display device (light-emitting location) as a base point. In addition, FIG. 13 is an enlarged view of a portion at a distance of 2,900 μm to 3,500 μm from the light-emitting location in FIG. 12.

As conditions of the simulation, the pixel pitch of the image display device 12 is set to 80 μm, and the diameter of the opening 102 of the transmission member 100 is set to 10 μm. In the simulation, calculation is carried out with an assumption that the openings broaden only in the horizontal axis direction. In actual cases, the openings also broaden in a direction penetrating the surface of paper. The disposition locations of the transmission member 100 are set to 3,000 μm for a first layer and 3,100 μm for a second layer from the image display device (light-emitting location). In addition, the calculation is carried out with an assumption that the width of the pixel of the image display device 12 is set to 10 μm and light is emitted from the center of the pixel at a variety of angles. Regarding the angles, light is assumed to be evenly emitted at intervals of 0.01 degrees from zero degrees to 30 degrees in the calculation. In addition, the size of the photosensitive recording medium 14 is set to 200 mm, and light travelling to the outside of the 200 mm is not taken in consideration in the calculation.

Figure 14:
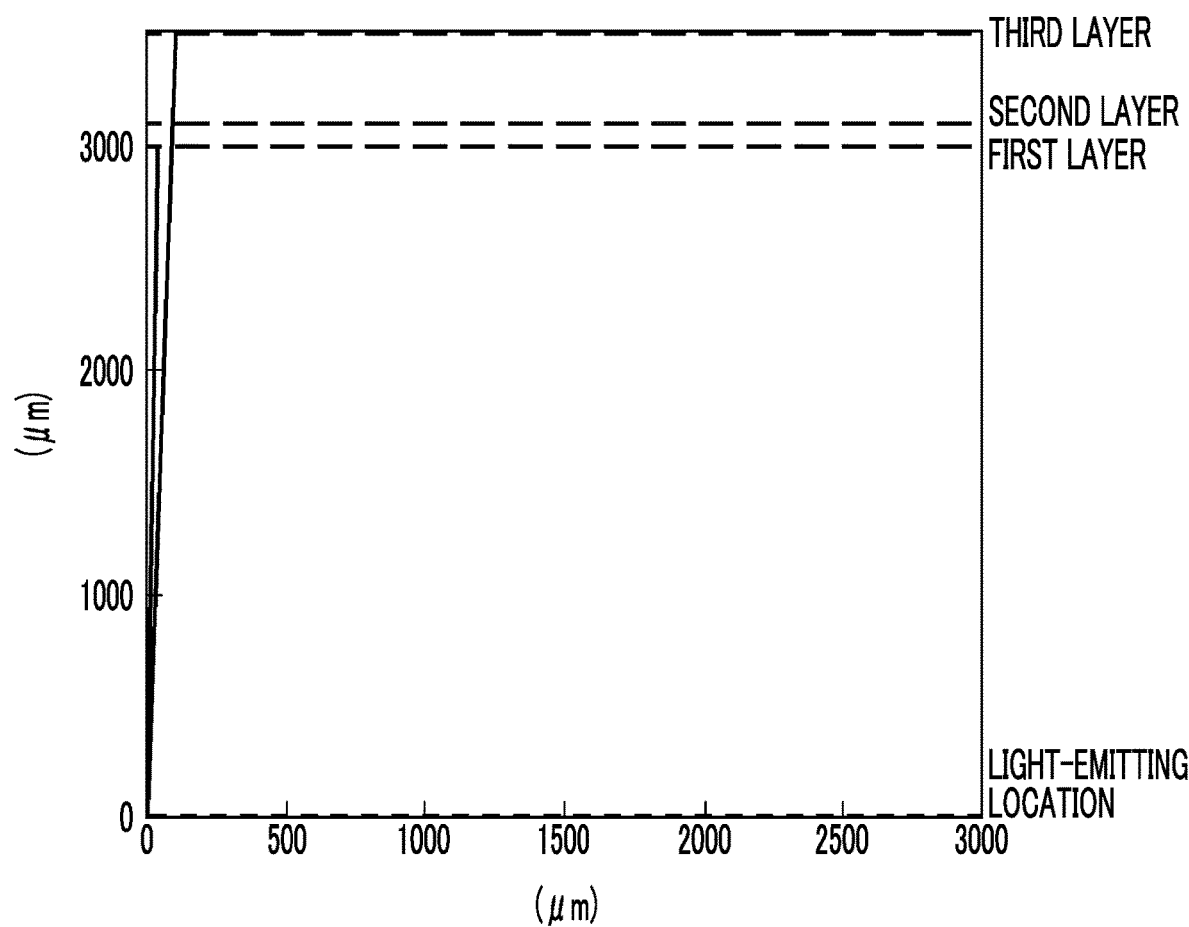
FIG. 14 is a view showing the passing of light by simulation in a case where three layers of the transmission members are disposed.
Figure 15:
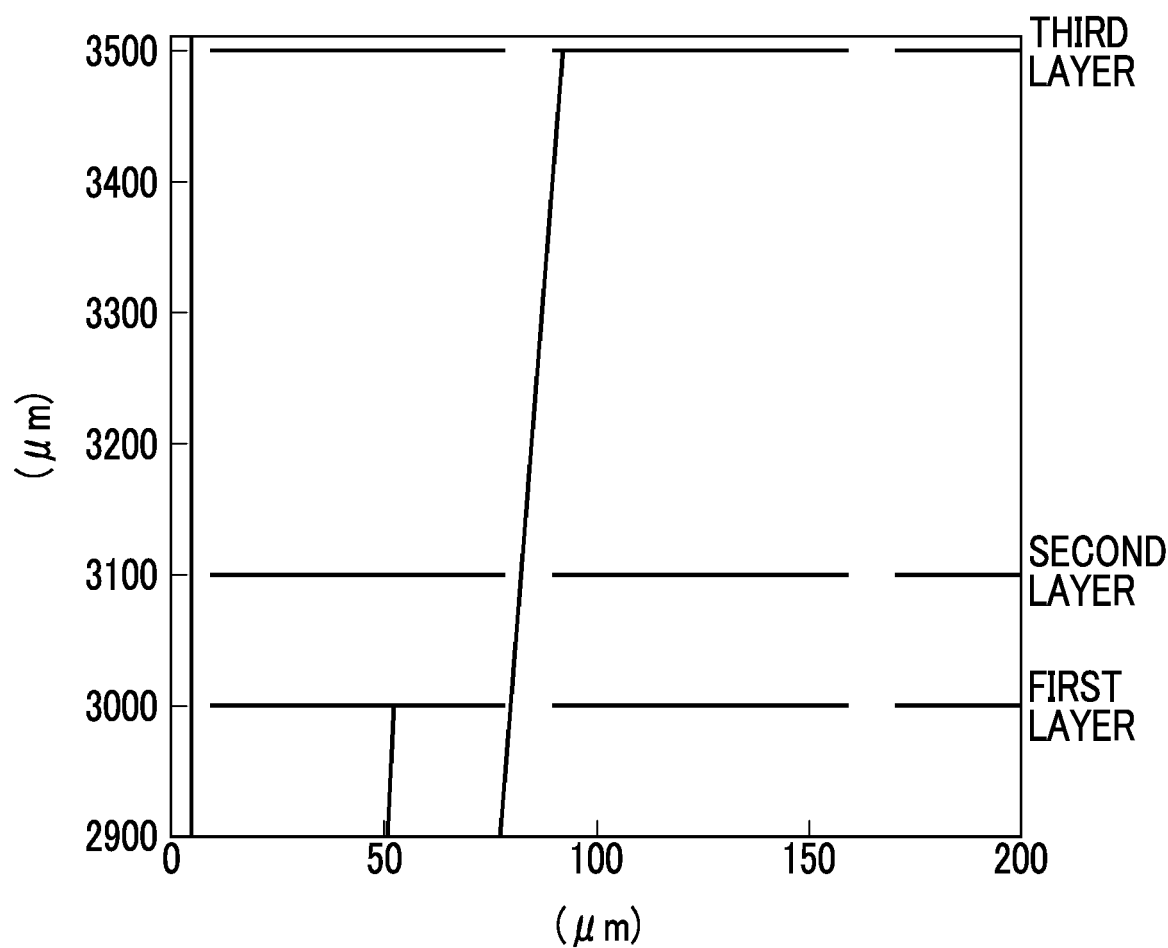
FIG. 15 is an enlarged view of FIG. 14.

In addition, FIG. 14 is a view showing a case where a transmission member is provided at a location 3,500 μm distant from the image display device in FIG. 12 as a third layer of the transmission member, and FIG. 15 is an enlarged view of a portion at a distance of 2,900 μm to 3,500 μm from the light-emitting location in FIG. 14.

Figure 13:
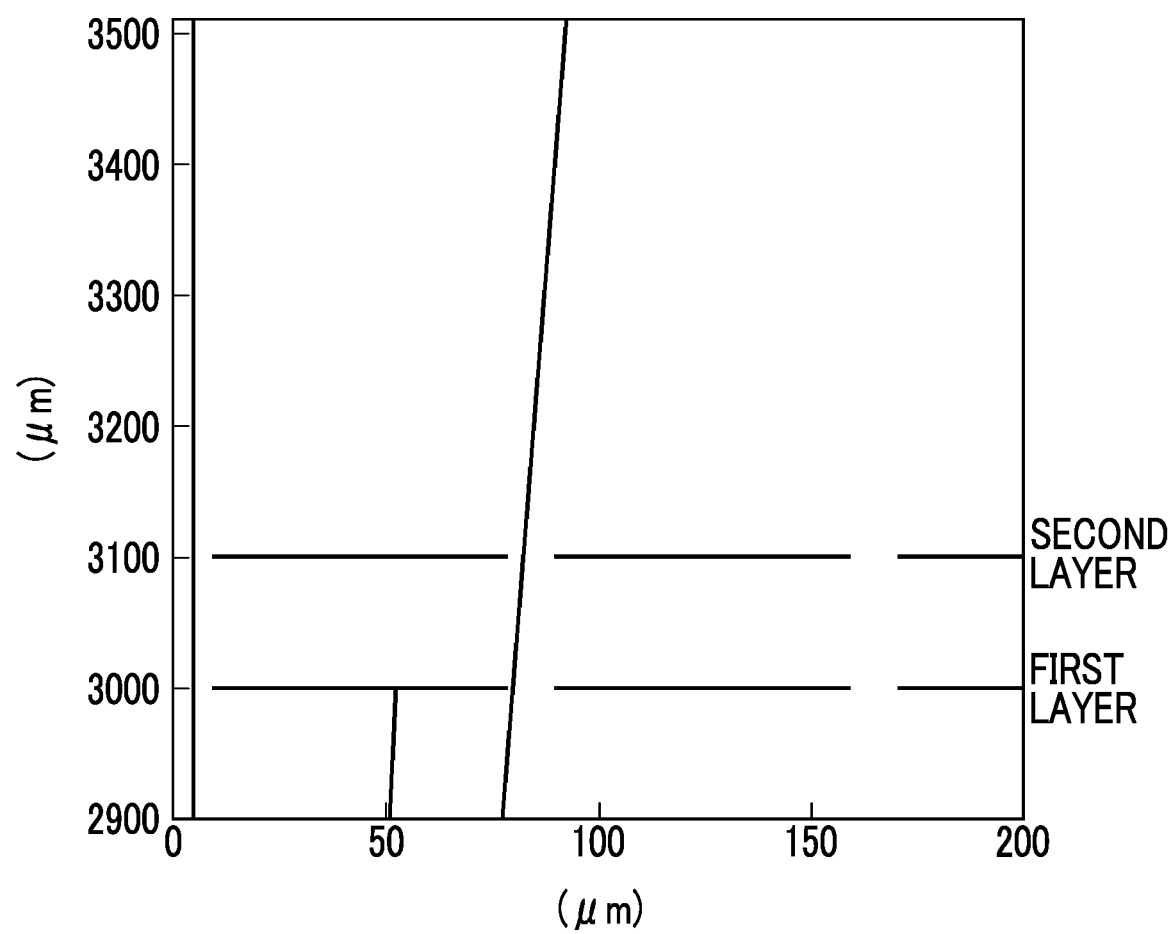
FIG. 13 is an enlarged view of FIG. 12.

Even for oblique light that has passed through two layers of the transmission members as shown in FIG. 13, in a case where the third layer of the transmission member is provided as shown in FIG. 15, it is possible to block the light using the third layer of the transmission member. Even in a case where light passes through the first layer of the transmission member and the second layer of the transmission member at the same opening locations in the horizontal axis direction as shown in FIG. 15, it is possible to block light obliquely radiated at a small angle by increasing the distance of the third layer of the transmission member.

Tables shown in FIG. 16 to FIG. 23 show simulation results of the numbers of light rays radiated from one opening of a transmission member at different locations. The simulation conditions are the same as described above except for the fact that the distance of the transmission member from the image display device is changed.

Figure 16:
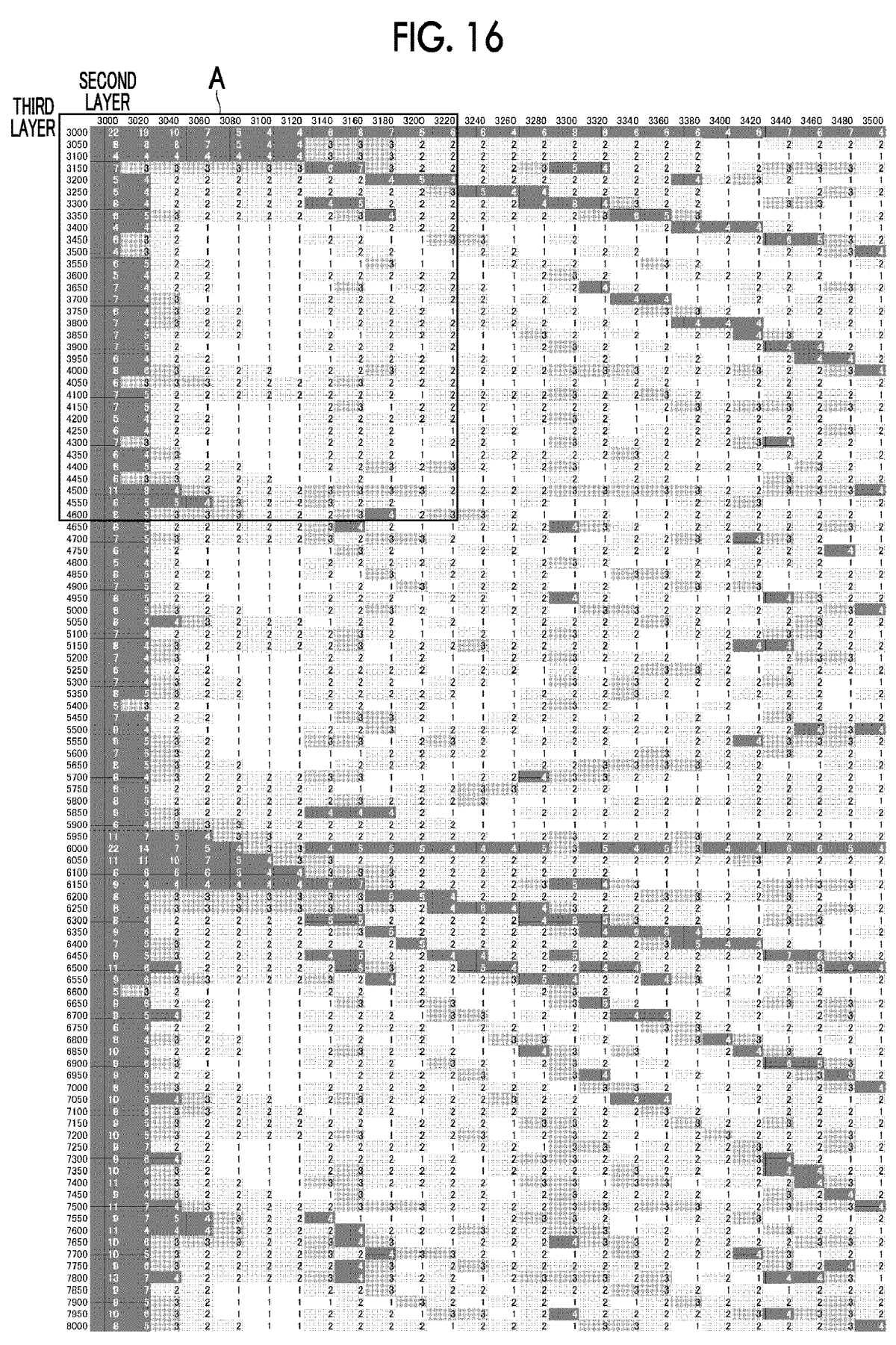

A table shown in FIG. 16 shows the numbers of transmitted light rays in a case where the distance of the transmission member is set to 3,000 μm from the image display device for the first layer, to numerical values in the upper column of the table for the second layer, and to numerical values in the left column of the table for the third layer. A disposition of the transmission member represented by a numerical value "1" in the drawing indicates a condition that only light parallel to the photosensitive recording medium from the image display device is allowed to pass through. Numerical values of "2" or more indicate that, in addition to the parallel light from the image display device, one or more oblique light rays pass through. The number of passing light rays is preferably one.

In addition, FIG. 17 is an enlarged view of a region A in FIG. 16. For example, in a case where the distance of the second layer is set to 3,100 μm from the image display device, for the third layer, 3,400 μm to 3,950 μm and 4,150 μm to 4,400 μm become preferred ranges. In addition, in the case of referring to FIG. 16, ranges of 4,750 μm to 5,000 μm, 5,200 μm to 5,650 μm, 6,600 μm to 7,000 μm, and 7,250 μm to 7,400 μm become preferred ranges.

In the simulation of the tables shown in FIG. 16 and FIG. 17, the pixels are one-dimensionally arrayed (that is, the width of the pixel pitch is 80 μm), but the pixels, actually, broaden two-dimensionally (broaden toward the rear of the paper), and the broadest pixel pitch lies in a diagonal line, which is a pitch of 113 μm that is 80 μm times the square root of two. In a case where the calculation is carried out under the above-described condition, regarding a distance at which no oblique light is generated (that is, the numerical value in the table reaches "1"), ranges in which the distance of the third layer of the transmission member is set to 3,300 μm to 4,450 μm, 4,700 μm to 5,800 μm, and 6,400 μm to 7,500 μm become preferred ranges. The preferred ranges become broader than those in a case where the pixel pitch is 80 μm. That is, in a case where a distance at which the pitch becomes narrowest is calculated, it is possible to determine the disposition of the transmission member in which oblique light can be blocked.

FIG. 18 shows results in a case where the distance of the first layer of the transmission member is set to 1,000 μm from the image display device. In a case where the distance of the first layer is shortened, as described above, it is possible to block, in light radiated from the image display device, obliquely radiated light at a broad range of angles using the first layer of the transmission member. This can be understood from the fact that FIG. 18 shows a number of cells with a numerical value "1". Therefore, it is possible to increase the degree of freedom in the disposition of the second layer and the third layer of the transmission members.

FIG. 19 shows results in a case where the distance of the first layer is set to 5,000 μm from the image display device, FIG. 20 shows results in a case where the distance of the first layer is set to 7,000 μm from the image display device, and FIG. 21 shows results in a case where the distance of the first layer is set to 8,000 μm from the image display device. As shown in FIG. 19 to FIG. 21, as the distance of the first layer increases, the condition in which only parallel light can be allowed to pass through becomes narrower.

Figure 22:
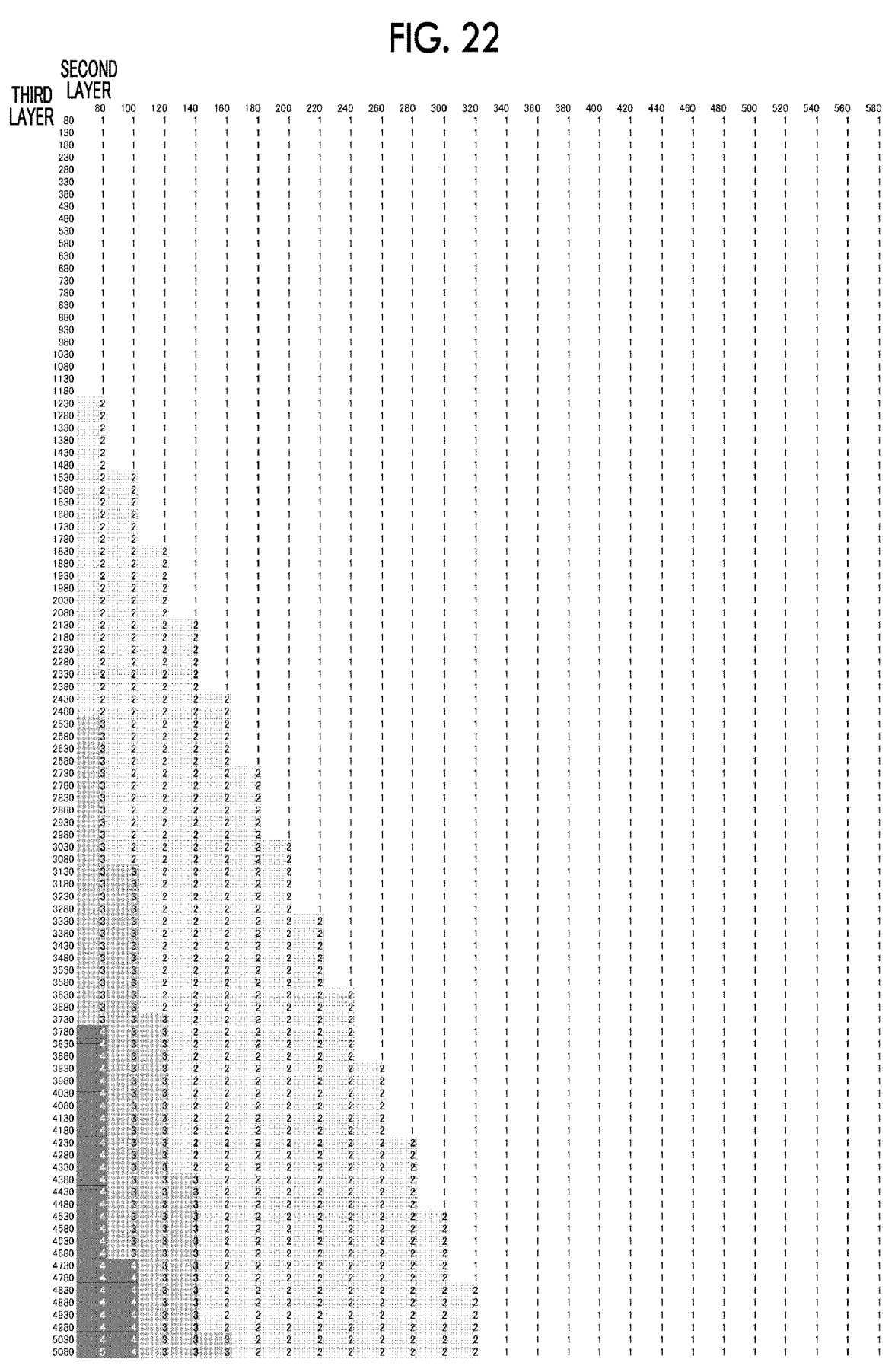

In addition, the numbers of transmitted light rays in a case where the distance of the transmission member is set to 80 μm from the image display device for the first layer, to numerical values in the upper column of the table for the second layer, and to numerical values in the left column of the table for the third layer are shown in FIG. 22. As shown in FIG. 22, in a case where the distance of the first layer is set to 80 μm from the image display device, it is possible to increase the degree of freedom in the distance from the image display device to the transmission member regarding the disposition of the second layer and the third layer of the transmission members.

Figure 23:
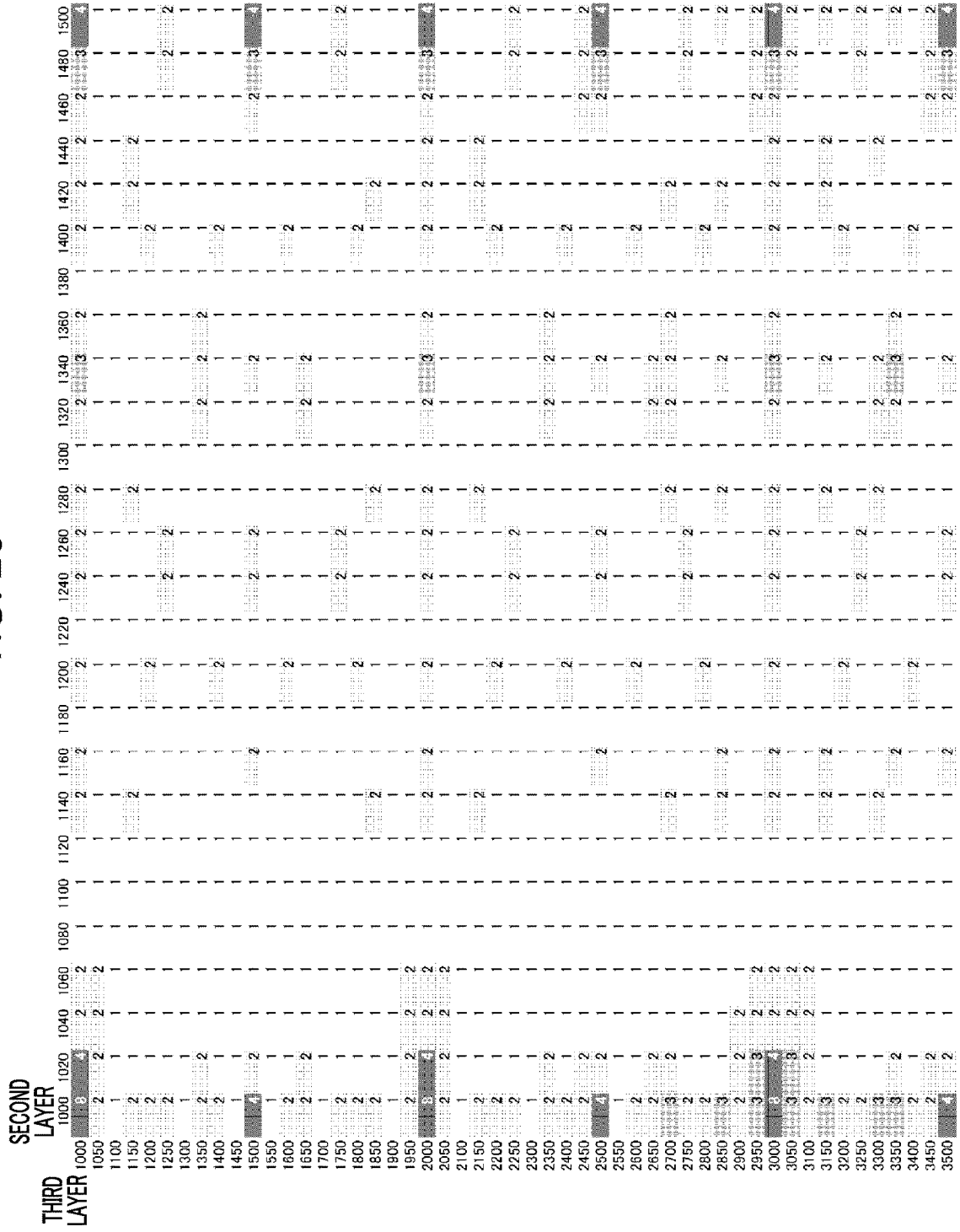
FIG. 23 is a table of the results obtained by simulation of the numbers of light rays that have passed through the openings.

Furthermore, FIG. 23 is a view showing, under the conditions shown in FIG. 18, in the case of providing the transmission member at a location 4,000 μm distant from the image display device as a fourth layer of the transmission member, the numbers of light rays that have passed through the transmission member. It can be confirmed that, in a case where the fourth layer of the transmission member is disposed, the number of light rays that have passed through the transmission member decreases compared with that in a case where three layers of the transmission members are disposed. Therefore, in a case where the fourth layer of the transmission member is disposed, it is possible to block obliquely radiated light, and it is possible to make light into only parallel light.

From the above-described simulation results, the distance of the first layer of the transmission member from the image display device is preferably set to 80 μm (that is, a distance identical to the length of the pixel pitch) or more. In addition, the upper limit of the distance of the first layer of the transmission member from the image display device is preferably set to 8,000 μm that is 100 times the pixel pitch. As shown in FIG. 19, in a case where the distance of the first layer of the transmission member is 8,000 μm or less from the image display device, there are conditions in which the number of transmitted light rays can be made to be one, and, furthermore, an image can be exposed only using parallel light by increasing the number of the transmission members.

EXPLANATION OF REFERENCES

10, 40, 70: image exposure device
12, 42, 72: image display device
13: pixel
14: photosensitive recording medium
16: transmitted light control portion
18: film pack
20: case
21: photosensitive recording medium support portion
22: exposure opening
26: glass window
58, 88: scanning means
60: support member
62: rail
64: support table
96: ball screw
98: movement portion
100: transmission member
102: opening
104: spacer
106: location determination hole

What is claimed is:

1. An image exposure device comprising:
an image display device having pixels;
a photosensitive recording medium support portion that supports a photosensitive recording medium for recording an image of the image display device in a state in which an exposure surface of the photosensitive recording medium faces the image display device; and
a transmitted light control portion that is provided between the image display device and the photosensitive recording medium support portion and is formed by laminating three or more layers of transmission members that have a plurality of openings formed therein and transmit only light incident on the openings,
wherein the plurality of openings is formed to be identical in size and location among the plurality of the laminated transmission members.

2. The image exposure device according to claim 1, wherein the transmitted light control portion further includes at least any one selected from a slit, a fiber optic plate, or a capillary plate.

3. The image exposure device according to claim 1, wherein the number of the layers of the transmission members is eight or less.

4. The image exposure device according to claim 1, wherein the transmission member has a location determination hole for determining a location of each of the transmission members in a case of laminating the plurality of transmission members.

5. The image exposure device according to claim 1, wherein at least one distance between adjacent transmission members is different from other distances between the transmission members.

6. The image exposure device according to claim 1, wherein the image display device has two-dimensionally arrayed pixels, and
the image exposure device exposes an entire two-dimensional region of the exposure surface of the photosensitive recording medium at the same time.

7. The image exposure device according to claim 1, wherein the image display device has one-dimensionally arrayed pixels, and
the image exposure device is configured to scan at least any one of the image display device or the photosensitive recording medium supported by the photosensitive recording medium support portion along a direction perpendicular to an array direction of the pixels of the image display device.

8. The image exposure device according to claim 1,
wherein the image display device has two-dimensionally arrayed pixels on a region having a smaller area than the exposure surface of the photosensitive recording medium, and
the image exposure device is configured to scan at least any one of the image display device or the photosensitive recording medium supported by the photosensitive recording medium support portion along an array direction of the pixels of the image display device and a direction perpendicular to the array direction of the pixels.

9. The image exposure device according to claim 7,
wherein, among exposure ranges by light from the pixels on a location at which the exposure surface of the photosensitive recording medium is supported, adjacent exposure ranges partially overlap each other.

10. An image exposure device comprising:
an image display device having pixels;
a photosensitive recording medium support portion that supports a photosensitive recording medium for recording an image of the image display device in a state in which an exposure surface of the photosensitive recording medium faces the image display device; and
a transmitted light control portion that is provided between the image display device and the photosensitive recording medium support portion and is formed by laminating three or more layers of transmission members that have a plurality of openings formed therein and transmit only light incident on the openings,
wherein a distance between the image display device and the transmission member closest to the image display device is equal to or more than a pixel pitch of the image display device.

11. An image exposure device comprising:
an image display device having pixels;
a photosensitive recording medium support portion that supports a photosensitive recording medium for recording an image of the image display device in a state in which an exposure surface of the photosensitive recording medium faces the image display device; and
a transmitted light control portion that is provided between the image display device and the photosensitive recording medium support portion and is formed by laminating three or more layers of transmission members that have a plurality of openings formed therein and transmit only light incident on the openings,
wherein a distance between the image display device and the transmission member closest to the image display device is equal to or less than 100 times a pixel pitch of the image display device.

12. An image exposure device comprising:
an image display device having pixels;
a photosensitive recording medium support portion that supports a photosensitive recording medium for recording an image of the image display device in a state in which an exposure surface of the photosensitive recording medium faces the image display device; and
a transmitted light control portion that is provided between the image display device and the photosensitive recording medium support portion and is formed by laminating three or more layers of transmission members that have a plurality of openings formed therein and transmit only light incident on the openings,
wherein, among the plurality of transmission members, a distance between the transmission member closest to the image display device and the transmission member farthest from the image display device is equal to or less than 100 times a distance of a pixel pitch of the image display device.

* * * * *